(12) United States Patent
Basker et al.

(10) Patent No.: US 8,242,578 B2
(45) Date of Patent: Aug. 14, 2012

(54) ANTI-FUSE DEVICE STRUCTURE AND ELECTROPLATING CIRCUIT STRUCTURE AND METHOD

(75) Inventors: Veeraraghavan S. Basker, Albany, NY (US); Toshiharu Furukawa, Essex Junction, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/072,023

(22) Filed: Mar. 25, 2011

(65) Prior Publication Data
US 2011/0169129 A1 Jul. 14, 2011

Related U.S. Application Data

(62) Division of application No. 12/031,761, filed on Feb. 15, 2008, now Pat. No. 7,935,621.

(51) Int. Cl.
*H01L 23/52* (2006.01)

(52) U.S. Cl. ........... 257/530; 257/50; 257/E23.142; 257/E23.143; 257/E23.145; 257/E23.146; 257/E23.147; 257/E23.151; 257/E23.168; 257/21.171; 438/128; 438/131; 438/132; 438/598; 438/600; 438/601; 438/618

(58) Field of Classification Search ............ None
See application file for complete search history.

(56) References Cited

U.S. PATENT DOCUMENTS

| | | | |
|---|---|---|---|
| 4,943,538 A | 7/1990 | Mohsen et al. | |
| 5,789,795 A | 8/1998 | Sanchez et al. | |
| 5,793,094 A | 8/1998 | Sanchez et al. | |
| 6,124,194 A | 9/2000 | Shao et al. | |
| 6,156,588 A | 12/2000 | Sanchez et al. | |
| 6,300,244 B1 | 10/2001 | Itabashi et al. | |
| 6,335,228 B1 | 1/2002 | Fuller et al. | |
| 6,596,149 B2 | 7/2003 | Horii | |
| 6,616,966 B2 | 9/2003 | Mathieu et al. | |
| 6,638,794 B2 | 10/2003 | Tseng | |
| 6,756,624 B2 | 6/2004 | Petrarca et al. | |
| 6,777,761 B2 | 8/2004 | Clevenger et al. | |
| 6,904,674 B2 | 6/2005 | Mune et al. | |
| 7,033,867 B2 | 4/2006 | Porter | |
| 7,115,493 B2 | 10/2006 | Forbes et al. | |
| 7,198,965 B2 | 4/2007 | He | |
| 7,776,680 B2 | 8/2010 | Basker et al. | |
| 2005/0017058 A1 | 1/2005 | Ho et al. | |

OTHER PUBLICATIONS

Andricacos et al., "Damascene Copper Electroplating for Chip Interconnections," IBM Journal of Research and Development, vol. 42, and No. 5, 1999, pp. 1-9. Basker et al., U.S. Appl. No. 12/031,761, Office Action Communication, Aug. 27, 2010, 7 pages.
Basker et al., U.S. Appl. No. 12/031,761, Notice of Allowance, Dec. 29, 2010, 9 pages.

*Primary Examiner* — Charles Garber
*Assistant Examiner* — Yasser Abdelaziez
(74) *Attorney, Agent, or Firm* — Gibb & Riley, LLC; Anthony J. Canale

(57) ABSTRACT

Disclosed are embodiments of a circuit and method for electroplating a feature (e.g., a BEOL anti-fuse device) onto a wafer. The embodiments eliminate the use of a seed layer and, thereby, minimize subsequent processing steps (e.g., etching or chemical mechanical polishing (CMP)). Specifically, the embodiments allow for selective electroplating metal or alloy materials onto an exposed portion of a metal layer in a trench on the front side of a substrate. This is accomplished by providing a unique wafer structure that allows a current path to be established from a power supply through a back side contact and in-substrate electrical connector to the metal layer. During electrodeposition, current flow through the current path can be selectively controlled. Additionally, if the electroplated feature is an anti-fuse device, current flow through this current path can also be selectively controlled in order to program the anti-fuse device.

7 Claims, 15 Drawing Sheets

US 8,242,578 B2

ANTI-FUSE DEVICE STRUCTURE AND ELECTROPLATING CIRCUIT STRUCTURE AND METHOD

CROSS-REFERENCE TO RELATED APPLICATIONS

This application is a Divisional of U.S. application Ser. No. 12/031,761 filed Feb. 15, 2008, U.S. Pat. No. 7,935,621, issued on May 3, 2011, the complete disclosure of which, in its entirety, is herein incorporated by reference.

FIELD OF THE INVENTION

The embodiments of the invention generally relate electroplating features onto a semiconductor wafer and, more particularly, to an anti-fuse device structure and a circuit and method for electroplating as well as programming the anti-fuse device structure.

BACKGROUND

Description of the Related Art

An electroplating circuit typically includes an anode (i.e., a source of metal or alloy), a cathode (i.e., an item to be electroplated with the metal or alloy), an electroplating bath for holding an electroplating solution into which the anode and cathode are submerged and an external power supply connected to the anode and cathode to provide a current flow through the circuit. Specifically, the current flow and, thereby, electron flow will cause metal ions in the electroplating solution to lose their charge and plate onto the cathode. This current flow will further cause the anode to replenish the metal ions in the solution.

Electroplating (i.e., electrodeposition) is often used to form back end of the line (BEOL) features, such as wires, metal-insulator-metal devices, capacitors, etc., on a semiconductor wafer. For example, as described in "Damascene copper electroplating for chip interconnections" by Andricacos et. al, IBM Journal of Research and Development, Vol. 42, No. 5, 1998, various techniques can be used for forming a BEOL electroplated feature on a semiconductor wafer. One technique involves forming a seed layer (i.e., a thinly deposited conductive layer) on the wafer. Next, a mask is formed on the seed layer such that only that portion of the seed layer to be plated is exposed. A contact at the wafer edge conducts current through the seed layer during electroplating. Once the electroplating process is completed, the mask layer is removed, followed by removal of any exposed seed layer. Another technique involves forming a single-tier trench for metal lines only or a double-tier trench for metal lines and via holes. Next, a blanket barrier layer and blanket conductive seed layer are formed. A contact at the wafer edge conducts current through the seed layer during electroplating. Once the electroplating process is completed, a chemical-mechanical polishing (CMP) process is used to remove barrier material, seed material and electroplating material outside the trench.

As mentioned above, each of these techniques requires the use of a contacted seed layer (i.e., a thinly deposited conductive layer) to provide a current path from the power supply to the cathode (i.e., from the power supply to the area of the wafer that is to be electroplated). In the former technique, once the electroplating process is complete, additional process steps are required to remove the mask and any excess seed layer that was not electroplated. In the latter technique, once the electroplating process is complete, additional process steps are required to remove any excess seed layer, barrier layer and electroplated material outside the trench. These additional processing steps increase manufacturing costs and time. Consequently, there is a need in the art for an electroplating circuit and an electroplating method, which eliminates the need to use a seed layer and which minimizes the number of subsequent processing steps.

SUMMARY

In view of the foregoing, disclosed herein are embodiments of a circuit and method for electroplating a feature, such as a back end of the line (BEOL) anti-fuse device, onto a semiconductor wafer. The electroplating circuit and method embodiments eliminate the use of a seed layer and, thereby, minimize subsequent processing steps. Specifically, the circuit and method embodiments allow for selective electroplating of one or more metal or alloy materials onto an exposed portion of a metal layer in a trench on the front side of a semiconductor substrate. This is accomplished by providing a unique wafer structure that allows a current path to be established from a power supply through a back side contact and in-substrate electrical connector to the metal layer. During electrodeposition, current flow and, thereby, electron flow, through the current path can be selectively controlled. Additionally, if the electroplated feature is an anti-fuse device, current flow through this current path can also be selectively controlled in order to program the anti-fuse device.

More particularly, disclosed herein are embodiments of a circuit for electroplating a feature (e.g., a back end of the line (BEOL) conductor, insulator, metal-insulator-metal (MIM) structure, capacitor, etc.) onto a semiconductor wafer. As with known electroplating circuits used for electroplating such features onto a semiconductor wafer, the circuit embodiments of the present invention can comprise a wafer, an electroplating solution in an electroplating bath, an anode submerged in the electroplating solution, an external power supply electrically connected to the anode, and an electroplating rack for holding the wafer submerged in the electroplating solution as well as for electrically connecting the wafer to the external power supply. However, in the circuit embodiments of the present invention, the wafer is configured differently than wafers used in prior art electroplating circuits so that a seed layer is not required for electrodeposition.

Specifically, the wafer can comprise a substrate with a front side and a back side. At least one metal layer can be positioned on the front side of the substrate and a dielectric layer can be positioned on the metal layer. A trench (e.g., a via hole, a contact hole, etc.) can extend through the dielectric layer such that a portion of the metal layer is exposed. Thus, the entire bottom surface of the trench comprises an exposed portion of the metal layer and, more particularly, comprises the cathode onto which the feature will be electroplated. No seed layer is required on the front side of the wafer or within the trench.

The wafer can further comprise a back side contact. Specifically, this contact can be positioned within and at the back side of the substrate. The external power supply can be electrically connected to the wafer through this back side contact. For example, the wafer can be placed in the electroplating rack such that the back side contact is electrically connected to the rack and, thereby, electrically connected to the external power supply.

Additionally, the wafer can comprise an in-substrate electrical connector. Specifically, this electrical connector can be positioned within the substrate between the contact and the metal layer. This electrical connector can be adapted to provide an electrical connection between the contact and the metal layer such that a current path is established from the power supply through the rack, through the back side contact, through the electrical connector and through the metal layer to the bottom surface of the trench.

The power supply can be adapted to pass a flow of current through this current path and either the electrical connector or the power supply itself can be adapted to selectively control the current flow. For example, the electrical connector can comprise a switch (e.g., a field effect transistor (FET), a diode, etc.) within the substrate that electrically connects the contact to the metal layer. This switch can be adapted to selectively control the current flow between the contact and the metal layer. Alternatively, the electrical connector can comprise a simple ohmic path within the substrate that electrically connects the contact and the metal layer. Current flow through this simple ohmic path can be selectively controlled by the external power supply itself.

During operation of the electroplating circuit, selective control of current flow through the current path between the power supply and the metal layer and, more particularly, between the power supply and the exposed portion of the metal layer at the bottom surface of the trench (i.e., between the power supply and the cathode) allows for selective control of electron flow. As discussed above, when the wafer is submerged in an electroplating solution in an electroplating bath, along with an anode, electron flow to the exposed portion of the metal layer at the bottom of the trench (i.e., to the cathode) will cause the metal or alloy ions in the electroplating solution to lose their charge and to plate onto the bottom surface of the trench.

In one particular embodiment, this electroplating circuit can be used to form one or more anti-fuse layers of a BEOL in-via hole or in-contact hole anti-fuse device on the semiconductor wafer and further can be used when programming such a BEOL anti-fuse device. More specifically, a BEOL anti-fuse device, formed using the above-described circuit, can comprise a plurality of anti-fuse layers. For example, the BEOL anti-fuse device can comprise a first anti-fuse layer on the bottom surface of the trench, a second anti-fuse layer on the first anti-fuse layer, and a third anti-fuse layer on the second anti-fuse layer. At least one of these anti-fuse layers can comprise electroplated layers (e.g., the first, second and, optionally, the third anti-fuse layers can be electroplated using the above described circuit).

As with conventional anti-fuse devices, the first and third anti-fuse layers can comprise layers of conductive materials (i.e., conductive plates) and the second anti-fuse layer can comprise a thin layer (e.g., approximately 100-500 angstroms) of dielectric material. In an exemplary configuration, the BEOL anti-fuse device can comprise a first anti-fuse layer comprising titanium nitride (TiN), a second anti-fuse layer comprising silicon dioxide ($SiO_2$) and a third anti-fuse layer comprising copper. However, alternative anti-fuse elements can include, but are not limited to, nickel (Ni), titanium (Ti), cobalt (Co), iron (Fe), copper (Cu), platinum (Pt), rhenium (Re) or ruthenium (Ru).

As discussed above, during operation of the circuit to electroplate a feature onto a semiconductor wafer and in this case to electroplate at least one of the anti-fuse layers of a BEOL anti-fuse device onto the bottom surface of a trench, the unique wafer structure allows for selective control of current flow through a current path between the power supply and the bottom surface of the trench onto which the anti-fuse layers are being electroplated. Since the wafer structure allows for selective control of current flow through the current path during operation of the circuit, it can further provide a means by which the anti-fuse device can subsequently be programmed. That is, a current above a specified limit can be applied to the first anti-fuse layer at the bottom of the trench via the previously established current path, thereby, causing metal ions to migrate into the second anti-fuse layer and reducing the resistance across the anti-fuse device (i.e., thereby, programming the anti-fuse device).

Also disclosed herein are embodiments of a method for electroplating a feature (e.g., a back end of the line (BEOL) conductor, insulator, metal-insulator-metal (MIM) structure, capacitor, etc.) onto a semiconductor wafer. As with known electroplating methods, the method embodiments of the present invention can comprise providing a wafer, providing an electroplating bath containing an electroplating solution, providing an anode submerged in the electroplating solution, providing an external power supply electrically connected to the anode, and providing a rack for electrically connecting the external power supply to the wafer and for holding the wafer submerged in the electroplating solution of the electroplating bath. However, in the method embodiments of the present invention the wafer is uniquely processed so that a seed layer is not required for electrodeposition.

Specifically, the method embodiments of the present invention comprise providing a wafer having a semiconductor substrate with a front side and a back side. During front end of the line (FEOL) processing of the wafer, a contact can be formed within and at the back side of the substrate. Next, an electrical connector can be formed within the substrate such that it is adjacent to and, more particularly, electrically connected to the back side contact.

The process of forming this electrical connector can comprise forming a switch (e.g., a field effect transistor, diode or any other suitable semiconductor switch) within the semiconductor substrate adjacent to the back side contact. Alternatively, the process of forming this electrical connector can comprise forming a simple ohmic path within the substrate adjacent to the back side contact.

Then, during back end of the line (BEOL) processing, at least one metal layer can be formed on the front side of the substrate adjacent to the in-substrate electrical connector. Specifically, during BEOL processing, interlayer dielectric and metal layers can be formed in an alternating pattern above the front side of the substrate and, more particularly, on the front side of the substrate above the in-substrate electrical connector (i.e., above the switch or simple ohmic path). As the interlayer dielectric and metal layers are formed, one or more via interconnects are formed in order to electrically connect the in-substrate electrical connector (i.e., the in-substrate switch or simple ohmic path) to the top metal layer of the pattern.

Next, a dielectric layer is formed on the top metal layer and a trench (e.g., a via hole, a contact hole, etc.) is formed through the dielectric layer in order to expose a portion of this top metal layer at the bottom surface of the trench. It should be noted that reference to top and bottom are somewhat arbitrary and are defined by the direction on the current flow during plating. Then, a feature is formed in this trench and, more particularly, a feature is formed on the exposed portion of the metal layer on the bottom surface of the trench. In order to form this feature, one or more electrodeposition processes are performed.

Specifically, a power supply is electrically connected to an anode and an electroplating rack. The wafer is placed in the electroplating rack such that the rack is electrically connected to the back side contact. Thus, a current path is established from the power supply through the rack, through the back side contact, the electrical connector, optionally through one or more vias and/or intermediate metal layers, through the top metal layer to the exposed portion of the top metal layer at the bottom surface of the trench (i.e., to the cathode). Then, the anode and the rack with the wafer are both submerged in the electroplating solution of the electroplating bath. Next, current flow from the power supply through the current path is selectively controlled (e.g., by either the optional switch or the power supply itself). Selective control of current flow and, thereby, electron flow through the current path between the power supply and the exposed portion of the metal layer at the bottom surface of the trench (i.e., between the power supply and the cathode) causes metal or alloy ions in the electroplating solution to lose their charge and to plate onto the bottom surface of the trench (i.e., to plate onto the cathode). This process can be repeated to create different layers of electroplated material within the trench.

Thus, the electroplating method, discussed above, can be used to electroplate any number of various different types of features onto the semiconductor wafer, including but not limited to, back end of the line (BEOL) conductors, insulators, metal-insulator-metal (MIM) structures, capacitors, anti-fuse devices, etc. In one particular embodiment, this electroplating method can be used when forming one or more anti-fuse layers of a BEOL in-via hole or in-contact hole anti-fuse device and further can be used when programming such a BEOL anti-fuse device.

More specifically, the BEOL anti-fuse device, discussed above, can be formed by electroplating a plurality of anti-fuse layers within a trench (i.e., within in a BEOL via or contact hole). To accomplish this, the wafer is processed, as described above. That is, a contact is formed within and at the back side of the wafer substrate. An electrical connector is formed within the substrate adjacent to the contact. A metal layer is formed on the front side of the substrate adjacent to the electrical connector. A dielectric layer is formed on the metal layer. A trench is formed in the dielectric layer so as to expose a portion of the metal layer at the bottom surface of the trench.

Then, the contact is electrically connected to the power supply such that a current path is established from the power supply through the contact and the electrical connector to the metal layer and, more particularly, to the exposed portion of the metal layer at the bottom surface of the trench (i.e., the cathode). This can be accomplished, for example, by electrically connecting an electroplating rack to power supply and then placing the wafer in the electroplating rack such that the back side contact is electrically connected to the electroplating rack.

Next, a first electrodeposition process can be performed. This first electrodeposition process can comprise electrically connecting the power supply to an anode. Then, the electroplating rack with the wafer and the anode are submerged in a first electroplating solution in the electroplating to a power supply such that the bottom surface of the trench is exposed to the first electroplating solution. During this first electrodepositing process, current flow and, thereby, electron flow, through the current path is selectively controlled (e.g., by either the in-substrate switch or the power supply itself) so as to electroplate a first anti-fuse layer onto the bottom surface of the trench.

After the first anti-fuse layer is plated onto the bottom surface of the trench, a second electrodepostion process can be performed. This second electrodeposition process can comprise replacing the first electroplating solution in the electroplating bath with a second electroplating solution and submerging the rack with the wafer in the second electroplating solution such that the first anti-fuse layer is exposed to the second electroplating solution. During this second electrodeposition process, current flow and, thereby, electron flow through the current path is selectively controlled (e.g., by either the in-substrate switch or the power supply itself) so as to electroplate a second anti-fuse layer onto the first anti-fuse layer in the trench.

After the second anti-fuse layer is plated onto the second anti-fuse layer, a third electrodepositon processes can be performed. This third electrodeposition process can comprise replacing the second electroplating solution in the electroplating bath with a third electroplating solution and submerging the rack with the wafer in the third electroplating solution such that the second anti-fuse layer is exposed to the third electroplating solution. As with the previously described electrodeposition processes, during this third electrodeposition process, current flow and, thereby, electron flow through the current path can be selectively controlled (e.g., by either the in-substrate switch or the power supply itself) so as to electroplate a third anti-fuse layer onto the second anti-fuse layer in the trench.

Alternatively, after the second anti-fuse layer is plated onto the second anti-fuse layer, a third anti-fuse layer can be formed on the second anti-fuse layer in the via/contact hole simultaneously with forming at least one standard via interconnect/contact on the wafer, using-well known standard deposition techniques.

Once the BEOL anti-fuse device is formed and BEOL wafer processing is completed, the BEOL anti-fuse device can be programmed by selectively controlling current flow through the current path in the same manner described above for electrodeposition. That is, a current path can be established from a power supply through the back side contact, through the electrical connector, through the metal layer to the BEOL anti-fuse device within the trench. Then, current flow through this current path can be selectively controlled (e.g., by either the switch or the power supply itself, depending upon the wafer structure) in order to apply a current above a specified limit to the anti-fuse device and, more particularly, to the first anti-fuse layer of the anti-fuse device adjacent to the bottom surface of the trench. This applied current will cause metal ions to migrate into the second anti-fuse layer, thereby, reducing resistance across the anti-fuse device (i.e., thereby, programming the anti-fuse device).

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 3b is a schematic diagram of the electroplating circuit of FIG. 2 incorporating the semiconductor wafer of FIG. 3a;

FIG. 4b is a schematic diagram of the electroplating circuit of FIG. 2 incorporating the semiconductor wafer of FIG. 4a;

FIG. 5b is a schematic diagram of the electroplating circuit of FIG. 2 incorporating the semiconductor wafer of FIG. 5a;

DETAILED DESCRIPTION OF EMBODIMENTS

Figure 1:
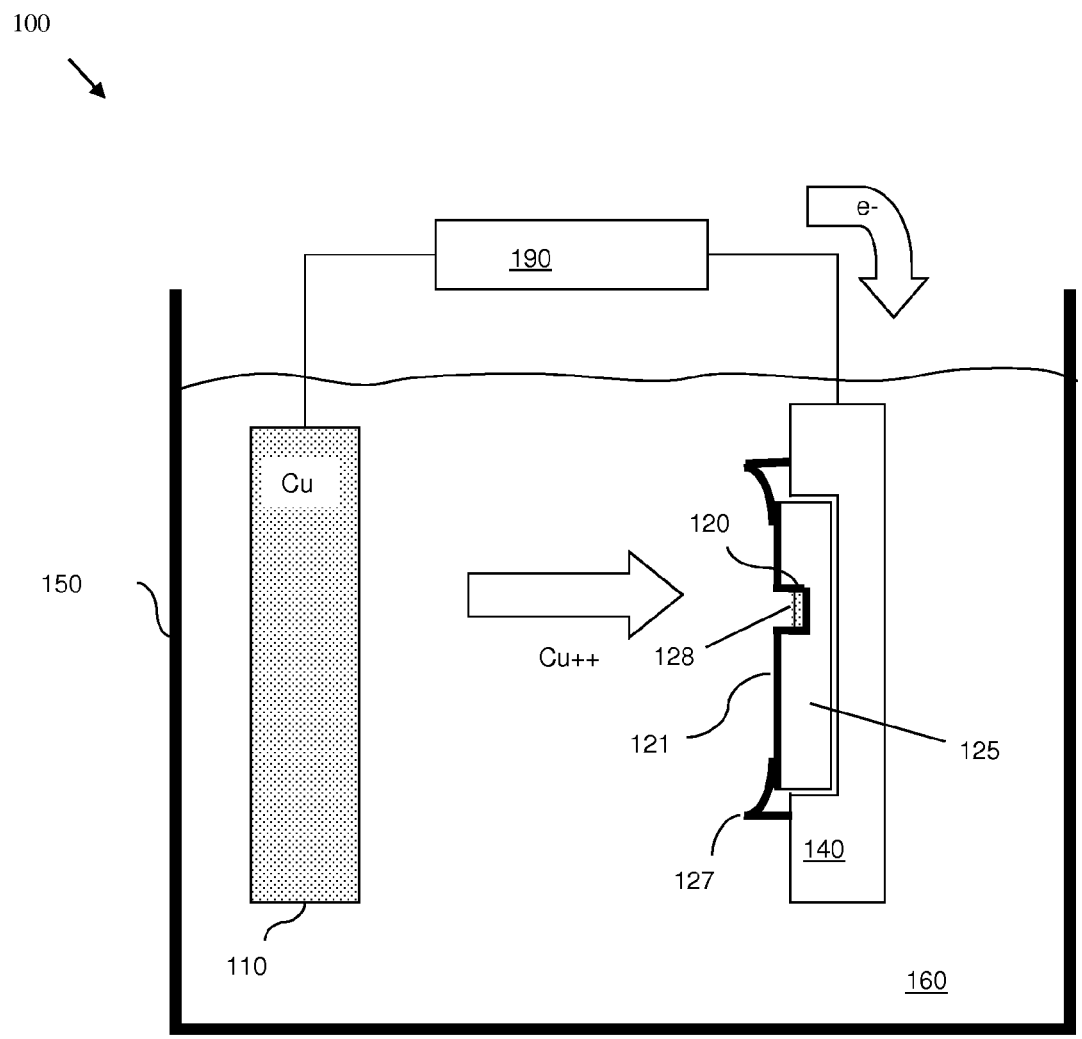
FIG. 1 is a diagram of an electroplating circuit for a semiconductor wafer.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As discussed above, electroplating (i.e., electrodeposition) is often used to form features, such as wires, metal-insulator-metal devices, capacitors, etc., on a semiconductor wafer. Referring to FIG. 1, an exemplary electroplating circuit 100 for electroplating such features on a semiconductor wafer 125 typically includes an anode 110 (i.e., a source of metal or alloy), a cathode 120 (i.e., the portion of the semiconductor wafer 125 to be electroplated with the metal or alloy), an electroplating bath 150 for holding the anode 110 and cathode 120 submerged in an electroplating solution 160, and an external power supply 190 (e.g., a battery) electrically connected to the anode 110 and the cathode 120 in order to provide a current flow through the circuit 100. A rack 140 is often used to hold the wafer 125 in the electroplating solution 160 and to provide the electrical connection between the power supply 190 and the wafer 125. During the electroplating process, the current flow will cause metal ions (e.g., Cu++) in the electroplating solution 160 to lose their charge and plate an electroplated layer 128 onto the cathode 120 and will further cause the anode 110 to replenish the metal ions in the solution 160.

However, also as discussed above, in order to ensure electron flow from the power supply 190 to the portion of the wafer 125 that is to be electroplated (i.e., to the cathode 120), a seed layer 121 is generally required. A seed layer 121 is a thinly deposited conductive layer that is formed so that it extends from the area of the wafer requiring plating 120 to the wafer's edge. At the wafer's edge, the seed layer 121 is electrically connected (e.g., by conductors 127) to the rack 140 in order to establish a current path from the power supply 190, through the rack 140, through the seed layer 121 to the portion 120 of the wafer to be electroplated. However, additional processing steps (e.g., removal of masks covering portions of the wafer not electroplated, chemical mechanical processing, etc.) must be formed in conjunction with using a seed layer during electroplating and these processing steps increase manufacturing costs and time. Consequently, there is a need in the art for an electroplating circuit and an electroplating method, which eliminate the need to use a seed layer and which minimize the number of subsequent processing steps.

In view of the foregoing, disclosed herein are embodiments of a circuit and method for electroplating a feature, such as a back end of the line (BEOL) anti-fuse device, onto a semiconductor wafer. The electroplating circuit and method embodiments eliminate the use of a seed layer and, thereby, minimize subsequent processing steps. Specifically, the circuit and method embodiments allow for selective electroplating of one or more metal or alloy materials onto an exposed portion of a metal layer in a trench on the front side of a semiconductor substrate. This is accomplished by providing a unique wafer structure that allows a current path to be established from a power supply through a back side contact and in-substrate electrical connector to the metal layer. During electrodeposition, current flow and, thereby, electron flow, through the current path can be selectively controlled. Additionally, if the electroplated feature is an anti-fuse device, current flow through this current path can also be selectively controlled in order to program the anti-fuse device.

Figure 2:
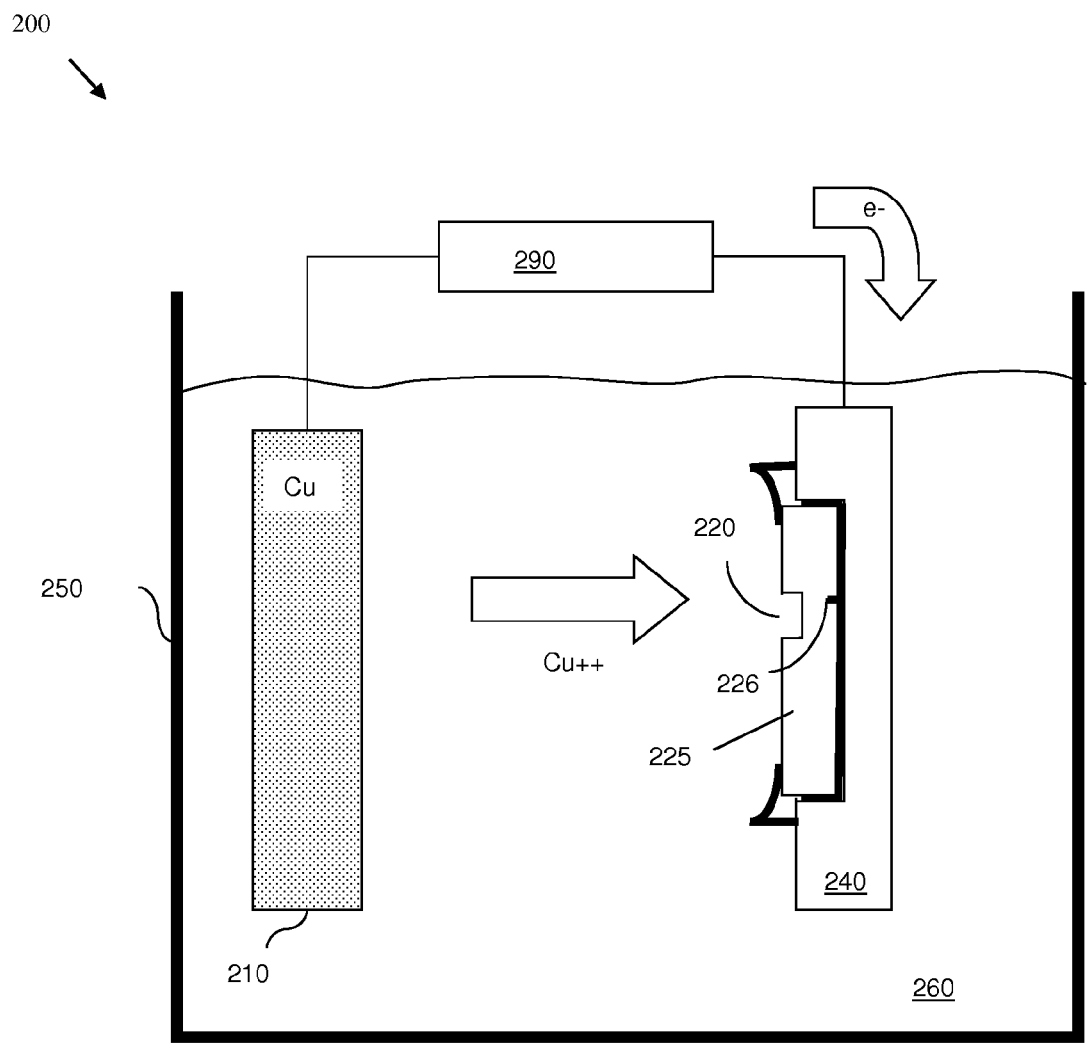
FIG. 2 is a diagram of an embodiment of an electroplating circuit for a semiconductor wafer according to the present invention.

More particularly, referring to FIG. 2, disclosed herein are embodiments of a circuit 200 for electroplating a feature (e.g., a back end of the line (BEOL) conductor, insulator, metal-insulator-metal (MIM) structure, capacitor, anti-fuse device, etc.) onto a semiconductor wafer 225. The electroplating circuit 200 embodiments can comprise many of the same features as set out in the exemplary electroplating circuit 100 of FIG. 1. For example, the electroplating circuit 200 can comprise an electroplating solution 260 in an electroplating bath 250, an anode 210 (i.e., a source of metal or alloy, e.g., Copper (Cu)) submerged in the electroplating solution 260, an external power supply 290 electrically connected to the anode 210, and an electroplating rack 240 for holding the wafer 225 submerged in the electroplating solution 260 as well as for electrically connecting the wafer 225 to the external power supply 290. However, in the circuit 200 embodiments of the present invention the wafer 225 is configured differently so that a seed layer is not required for electrodeposition.

Figure 3A:
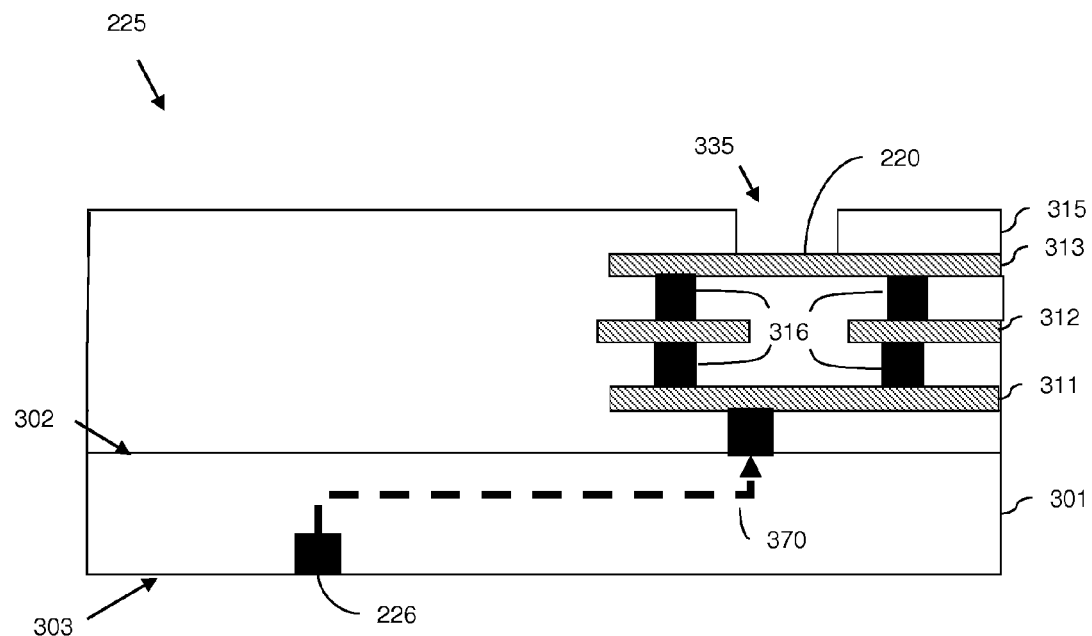
FIG. 3a is cross-section diagram of a semiconductor wafer with a back side contact and in-substrate electrical connector (e.g., a switch or simple ohmic path) that may be incorporated into the electroplating circuit of FIG. 2.

Specifically, referring to FIG. 3a in combination with the circuit diagram of FIG. 2, the wafer 225 can comprise a substrate 301 (e.g., a bulk silicon wafer, a silicon-on-insulator (SOI) wafer, etc.), having a front side 302 and a back side 303. The wafer 225 can further comprise at least one metal layer (see metal layers 311-313) on the front side 302 of the substrate 301 and a dielectric layer 315 on the top metal layer 313. A trench 335 (e.g., a via hole, a contact hole, etc.) can extend through the dielectric layer 315 such that a portion of the metal layer 313 is exposed. Thus, the entire bottom surface of the trench 335 comprises an exposed portion of the top metal layer 313 and, more specifically, comprises the cathode 220 (i.e., the portion of the wafer to be electroplated).

The wafer 225 can further comprise a back side contact 226. Specifically, this contact 226 can be positioned within and at the back side 303 of the substrate 301. The external power supply 290 can be electrically connected to the wafer 225 through this back side contact 226. For example, the wafer 225 can be placed in the electroplating rack 240 such that the back side contact 226 is electrically connected to the electroplating rack 240 and, thereby, electrically connected to the external power supply 290.

Figure 3B:
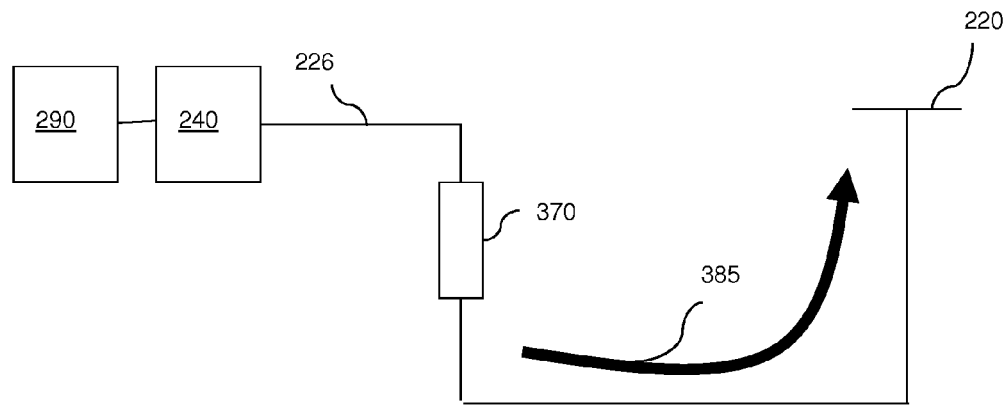

Additionally, the wafer 225 can comprise an in-substrate electrical connector 370. Specifically, this electrical connector 370 can be positioned within the substrate 301 between the back side contact 226 and the metal layer 313. This electrical connector 370 can be adapted to provide an electrical connection between the contact 226 and the metal layer 313 such that, as illustrated in FIG. 3b, a current path 385 is established from the external power supply 290, through the electroplating rack 240, through the back side contact 226, through the electrical connector 370, through interconnects 316 and intermediate metal layers 311-312, through the top metal layer 313 to the exposed portion of the metal layer at the bottom surface of the trench 335 (i.e., to the cathode 220).

The power supply 290 can be adapted to pass a flow of current through this current path and either the electrical connector 370 or the power supply itself can be adapted to selectively control the current flow through the current path 385. For example, the in-substrate electrical connector 370 can comprise a switch (e.g., a field effect transistor (see FIGS. 4a-4b), a diode (see FIGS. 5a-5b) or any other suitable semiconductor switch) within the substrate 301 such that it electrically connects the contact 226 to the metal layer 313 (e.g., via interconnects 316 and intermediate metal layers 311-312). This switch can be adapted to selectively control the current flow through the path 385 between the contact 226 and metal layer 313. Alternatively, the electrical connector 370 can comprise a simple ohmic path within the substrate 301 that electrically connects the contact 226 to the metal layer 313 (e.g., via interconnects 316 and intermediate metal layers 311-312). Current flow through this simple ohmic path can be selectively controlled by the external power supply 290 itself.

Figure 4A:
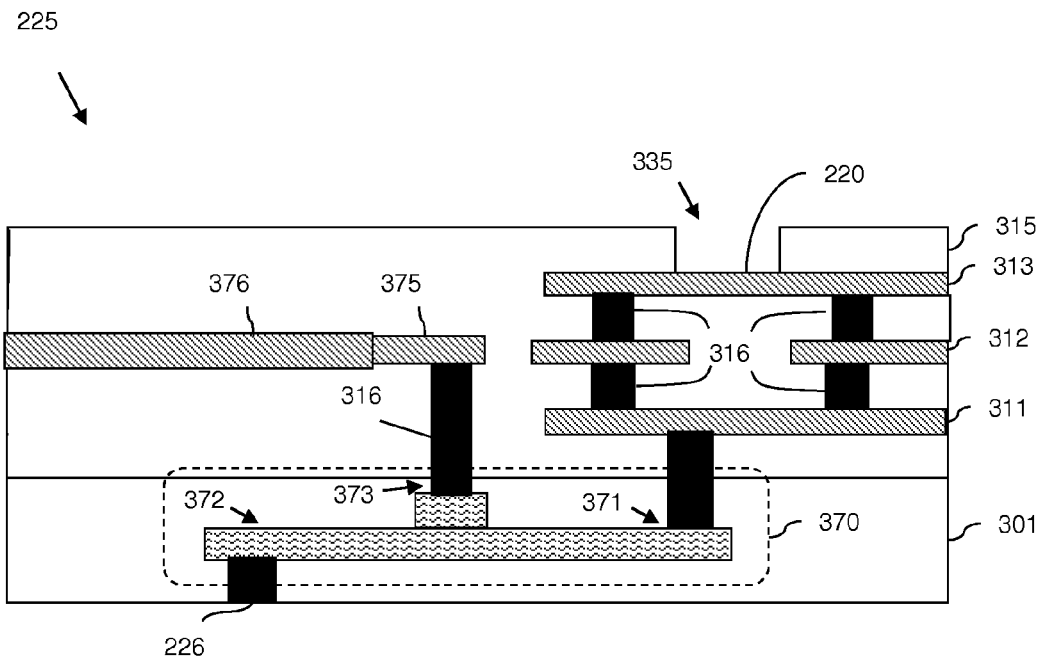
FIG. 4a is a cross-section diagram of a semiconductor wafer with a back side contact and in-substrate transistor-type switch that may be incorporated into the electroplating circuit of FIG. 2.
Figure 4B:
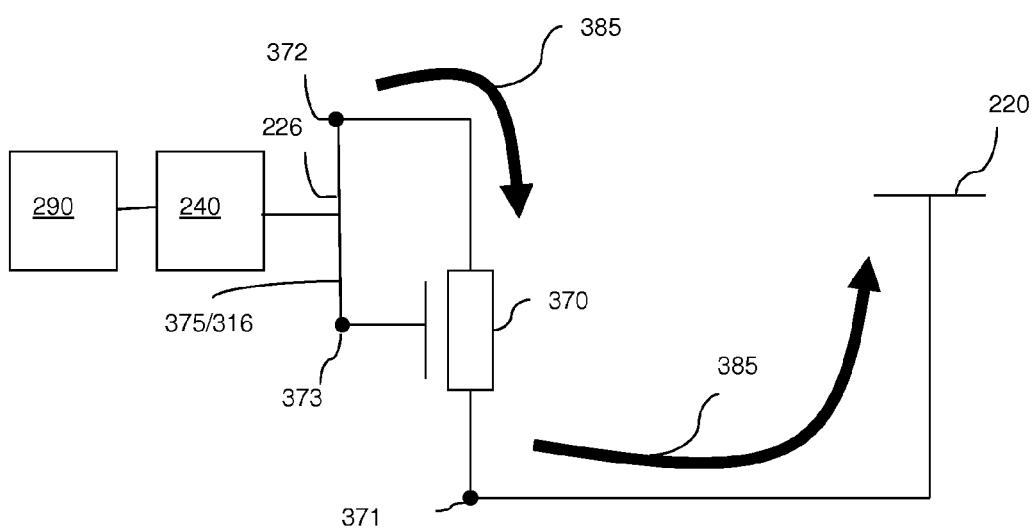

More specifically, referring to FIG. 4a in combination with FIG. 2, the electrical connector 370 can comprise a field effect transistor. The first node 371 (e.g., the drain region) of the field effect transistor can be electrically connected to the top metal layer 313 (e.g., by means of one or more via interconnects 316 and one or more intervening metal layers 311-312) and, thereby, electrically connected to the bottom surface of trench 335 (i.e., electrically connected to the cathode 220). The second node 372 (e.g., the source region) of the field effect transistor can be electrically connected to the back side contact 226 and, thereby, electrically connected to the power supply 290 (e.g., through rack 240). Finally, the third node 373 (e.g., the gate) of the field effect transistor can be electrically connected to the power supply 290 through rack 240 by interconnect 316, metal pad 375 and wire 376 that extend to the wafer's edge. Thus, as illustrated in FIG. 4b, if the electrical connector 370 comprises a field effect transistor, when the wafer 225 is placed in rack 240, a current path 385 is established from the external power supply 290, through the rack 240, through the back side contact 226 through the nodes 372-371 of the FET (i.e., of the electrical connector 370) to the exposed portion of the metal layer 313 at the bottom surface of the trench 335 (i.e., to the cathode 220). Current flow and, thereby, electron flow, through this current path 385 can be selectively controlled depending upon the voltage applied at gate 373 through wire 376, metal pad 375 and interconnect 316.

Figure 5A:
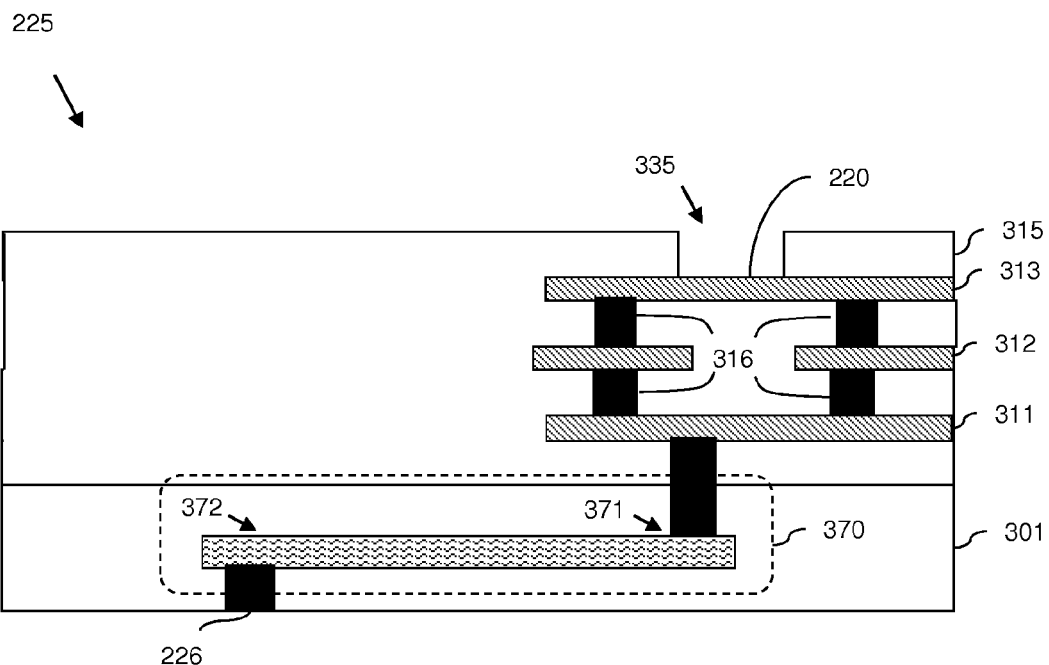
FIG. 5a is a cross-section diagram of a semiconductor wafer with a back side contact and in-substrate diode-type switch that may be incorporated into the electroplating circuit of FIG. 2.
Figure 5B:
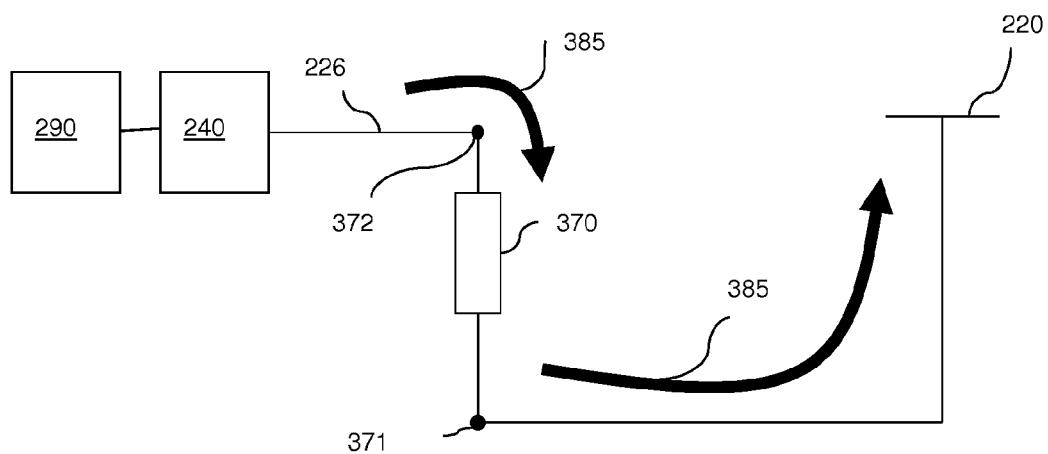

Alternatively, referring to FIG. 5a in combination with FIG. 2, the electrical connector 370 can alternatively comprise a diode. The first node 371 of the diode can be electrically connected to the top metal layer 313 (e.g., by means of one or more via interconnects 316 and one or more intervening metal layers 311-312) and, thereby, electrically connected to the exposed portion of the metal layer at the bottom surface of trench 335 (i.e., electrically connected to the cathode 220). The second node 372 of the diode can be electrically connected to the back side contact 226 and, thereby, electrically connected to the power supply 290 (e.g., through rack 240). Thus, as illustrated in FIG. 5b, if the electrical connector 370 comprises a diode, when the wafer 225 is placed in rack 240, a current path 385 is established from the external power supply 290, through the rack 240, through the back side contact 226 through the nodes 372-371 of the diode (i.e., of the electrical connector 370) to the exposed portion of the metal layer 313 at the bottom surface of the trench 335 (i.e., to the cathode 220). Current flow and, thereby, electron flow, through this current path 385 can be selectively controlled depending upon the voltage applied at node 372.

Figure 6:
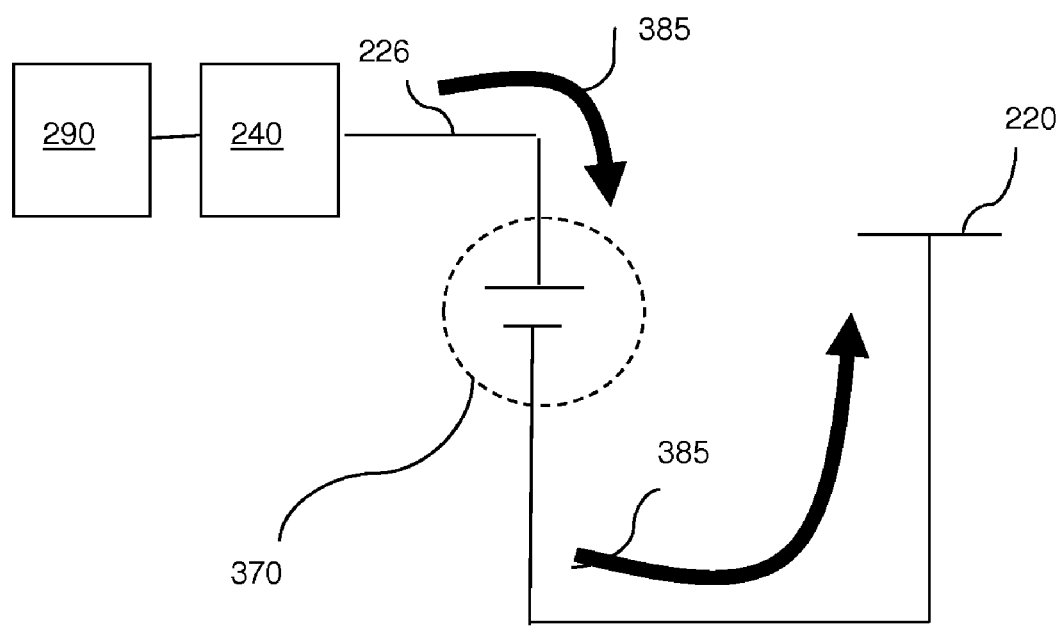
FIG. 6 is a schematic diagram of the electroplating circuit of FIG. 2 incorporating a semiconductor wafer with a back side contact and in-substrate simple ohmic path.

Alternatively, referring to FIG. 6 in combination with FIG. 2, the electrical connector 370 can comprise a simple ohmic path electrically connected between the back side contact 226 and the exposed portion of the metal layer 313 at the bottom surface of the trench 335 (i.e., and the cathode 220). Thus, when the wafer 225 is placed in rack 240, a current path 385 is established from the external power supply 290, through the rack 240, through the back side contact 226, through the ohmic path (i.e., through the electrical connector 370) to the exposed portion of the metal layer 313 at the bottom surface of the trench 335 (i.e., to the cathode 220). Current flow and, thereby, electron flow, through this current path 385 can be selectively controlled by the external power supply 290 itself.

Referring again to FIG. 2, during operation of the electroplating circuit 200, selective control of current flow through the current path 385 (see FIGS. 3b, 4b, 5b and FIG. 6) between the power supply 290 and the metal layer 313 and, more particularly between the power supply 290 and the exposed portion of the metal layer at the bottom surface of the trench (i.e., between the power supply 290 and the cathode 220) allows for selective control of electron flow. As discussed above, when the wafer is submerged in an electroplating solution 260 in an electroplating bath 250, along with an anode, electron flow to the cathode 220 (i.e., to the exposed portion of the metal layer 313 at the bottom surface of the trench 335) will cause metal ions (e.g., Cu++) in the electroplating solution 260 to lose their charge and plate onto the onto the cathode 220 and will further cause the anode 210 to replenish the metal ions in the solution 260.

This electroplating circuit 200 can be used to electroplate any number of various different types of features on the wafer 225, including but not limited to, back end of the line (BEOL) conductors, insulators, metal-insulator-metal (MIM) structures, capacitors, anti-fuse devices, etc.

Figure 7:
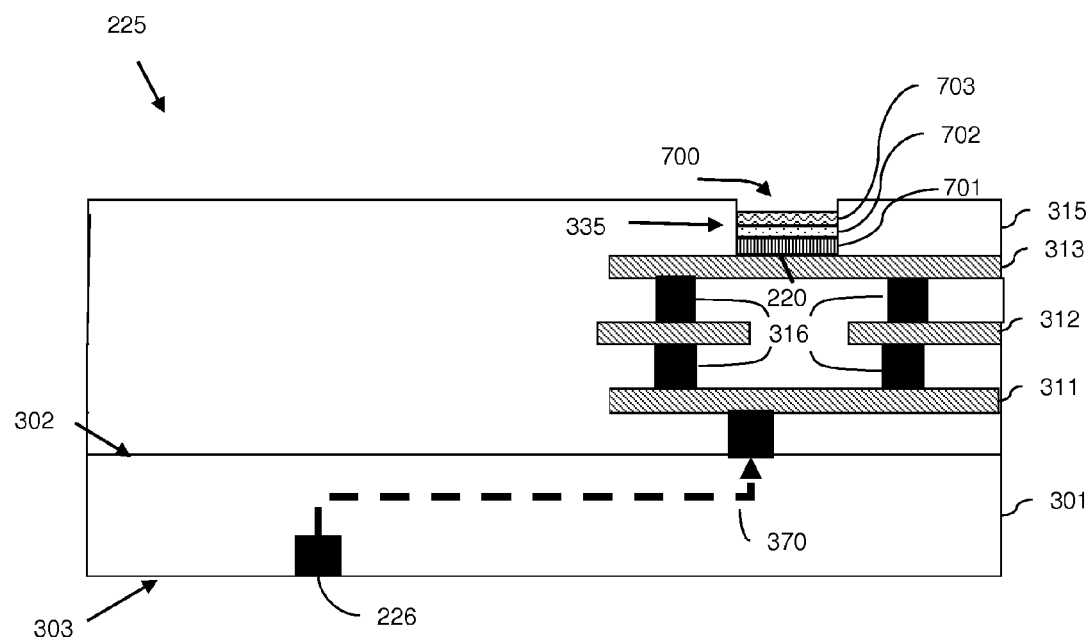
FIG. 7 is a cross-section diagram of a semiconductor wafer having an exemplary BEOL anti-fuse device with at least one anti-fuse layer electroplated using the circuit of FIG. 2.

For example, referring to FIG. 7 in combination with FIG. 2, in one particular embodiment, the electroplating circuit 200 can be used when forming one or more anti-fuse layers 701-703 of a BEOL in-via hole or in-contact hole anti-fuse device 700 on the semiconductor wafer 225. The anti-fuse device 700 comprises a plurality of anti-fuse layers 701-703. Theses layer 701-703 can be formed in the trench 335 (e.g., in a back end of the line (BEOL) via hole or contact hole) that extends through the dielectric layer 315 to the metal layer 313 and can, more particularly, be formed without a seed layer in the via/contact hole. Specifically, this anti-fuse device 700 can comprise a first anti-fuse layer 701 directly adjacent to the exposed portion of the metal layer 313 at the bottom surface 220 of the trench. A second anti-fuse layer 702 can be positioned on the first anti-fuse layer 701 and a third anti-fuse layer 703 can be positioned on the second anti-fuse layer 702.

As with conventional anti-fuse devices, the first and third anti-fuse layers 701 and 703 can comprise layers of conductive materials (i.e., conductive plates) and the second anti-fuse layer 502 can comprise a thin layer (e.g., approximately 100-500 angstroms) of dielectric material. Those skilled in the art will recognize that anti-fuse devices 700 perform in a manner opposite that of fuses. That is, a fuse provides a low resistance electrical connection until the fuse is programmed (i.e., blown by allowing a current which exceeds a specified limit to flow through the fuse), at which time the connection is broken. Contrarily, only upon programming (i.e., by applying a current above a specified limit) does an anti-fuse device 700 provide a low resistance electrical connection due to migration of metal ions into the second anti-fuse layer 702.

In an exemplary configuration, the BEOL anti-fuse device 700 can comprise a titanium nitride (TiN) layer (i.e., the first anti-fuse layer 701) formed, for example, by electrodeposition directly onto the exposed portion of the metal layer 313 at the bottom surface of the trench 335 (i.e., directly on the cathode 220). The anti-fuse device 700 can further comprise a silicon dioxide ($SiO_2$) layer (i.e., the second anti-fuse layer 702) formed, for example, by electrodeposition on the titanium nitride (TiN) layer. Finally, the anti-fuse device 700 can comprise a copper (Cu) layer (i.e., a third anti-fuse layer 703) formed, for example, by electrodeposition or by standard via processing on the silicon dioxide ($SiO_2$) layer. This configuration has the added benefit of allowing for copper ion (Cu++) assist during subsequent programming of the anti-fuse device 700. However, alternative anti-fuse elements can include, but are not limited to, nickel (Ni), titanium (Ti), cobalt (Co), iron (Fe), copper (Cu), platinum (Pt), rhenium (Re) and ruthenium (Ru).

As discussed in detail above, during operation of the circuit 200 to electroplate a feature onto a semiconductor wafer and in this case to electroplate at least one of the anti-fuse layers of a BEOL anti-fuse device 700 onto the bottom surface of a trench, the unique wafer structure 225 of the present invention allows for selective control of current flow through a current path between the power supply and the bottom surface of the trench onto which the anti-fuse layers are being electroplated. Since the wafer structure 225 allows for selective control of current flow through the current path during operation of the circuit 200, it can further provide a means by which the anti-fuse device can subsequently be programmed.

More specifically, as discussed in detail above, the wafer structure 225 comprises a back side contact 226 and in-substrate electrical connector 370 (e.g., a switch or simple ohmic path) that can be used to establish a current path 385 in an electroplating circuit 200 from the power supply 290, through an electroplating rack 240, through the back side contact 226, through the electrical connector 370, through the metal layer 313 to the cathode 220 (e.g., see FIGS. 2 and 3a-3b). Also, as discussed above, current flow through this current path 385 can be selectively controlled, depending upon the embodiment, by either the electrical connector 370 (e.g., if the electrical connector 370 comprises an in-substrate switch, see FIGS. 4a-b and 5a-b) or the power supply 290 itself (e.g., if the electrical connector 370 comprises a simple ohmic path, see FIG. 6). Selectively controlling current flow through the current path 385 allows for electrodeposition of a feature (e.g., an anti-fuse device) into the trench 335.

Figure 8:
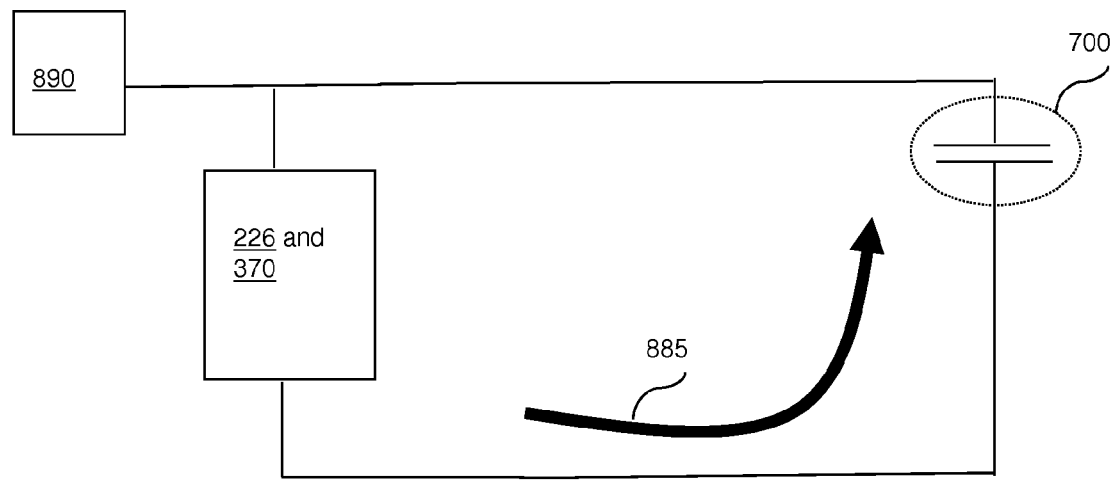
FIG. 8 is a schematic diagram illustrating a programming circuit for the BEOL anti-fuse device of FIG. 5.

Additionally, referring to FIG. 8 in combination with FIG. 7, since current flow to an anti-fuse device 700 is also required for anti-fuse device programming, selective control of current flow through a similar current path 885 between a power supply 890 and the metal layer 313 and, more particularly between a power supply 890 and the bottom surface of the trench adjacent to the first layer 701 of the anti-fuse device 700 can provide the means by which the anti-fuse device 700 is programmed. That is, applying a current above a specified limit to the anti-fuse device 700 and, more particularly, to the first anti-fuse layer 701 of the anti-fuse device 700 through a current path 885 (i.e., a current path from a power supply 890, through the back side contact 226, through the in-substrate electrical connector 370, (optionally) through one or more interconnects 316 and intermediate metal layers 311-312, through the metal layer 313, to the first anti-fuse layer 701) causes metal ions to migrate into the second anti-fuse layer 702 and, thereby, reduces resistance across the anti-fuse device 700 (i.e. programs the anti-fuse device). Thus, the wafer 225 structure is also specifically adapted to provide selective control of current flow to a BEOL anti-fuse device 700 during programming.

Figure 9:
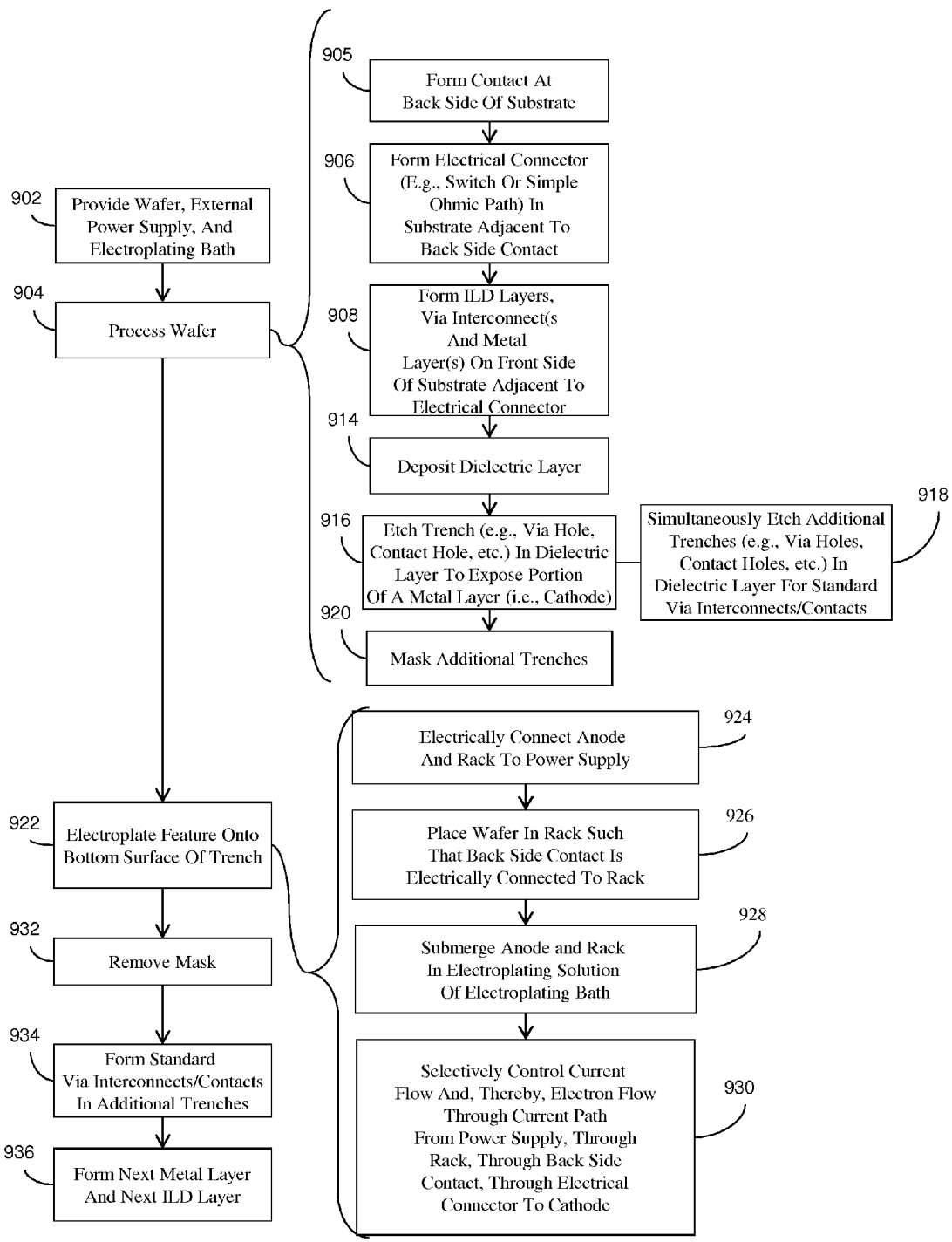
FIG. 9 is a flow diagram illustrating an embodiment of an electroplating method according to the present invention.

Referring to FIG. 9 also disclosed herein are embodiments of a method for electroplating a feature (e.g., a back end of the line (BEOL) conductor, insulator, metal-insulator-metal (MIM) structure, capacitor, anti-fuse device, etc.) onto a semiconductor wafer. As with known electroplating methods, the method embodiments of the present invention can comprise providing a wafer 225 having a substrate, providing an electroplating bath 260 containing an electroplating solution 260, providing an anode 210 submerged in the electroplating solution 260, providing an external power supply 290 electrically connected to the anode 210, and providing an electroplating rack for electrically connecting the external power supply 290 to the wafer 225 and for holding the wafer 225 submerged in the electroplating solution 260 in the electroplating bath (902, see FIG. 2). However, in the method embodiments of the present invention the wafer 225 is processed so that a seed layer is not required for electrodeposition (904).

Figure 11:
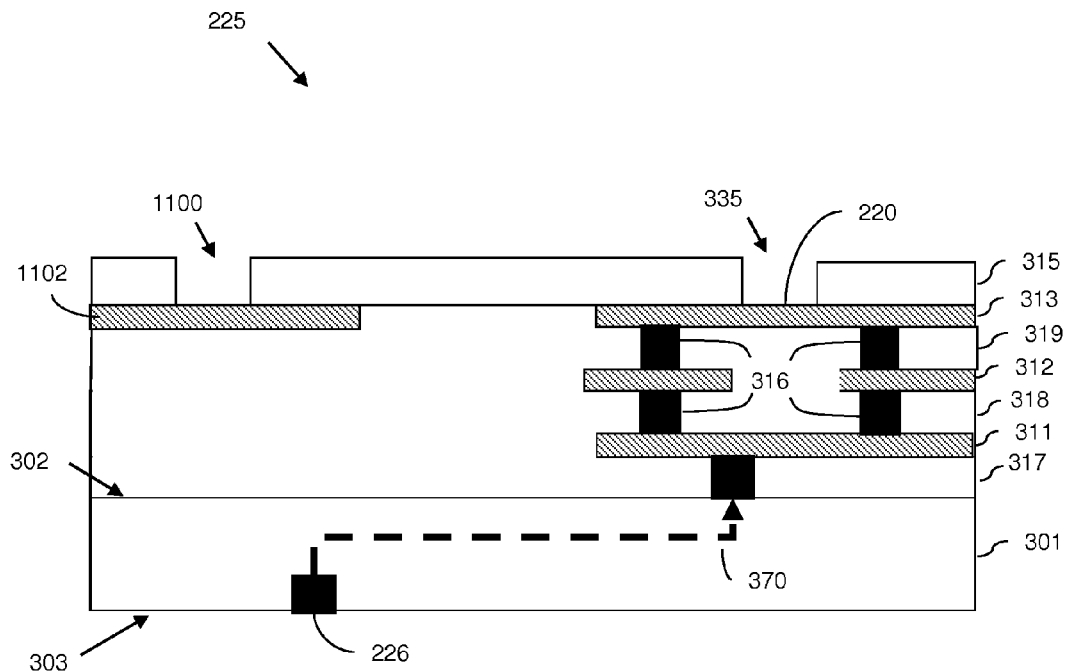
FIG. 11 is a cross-section diagram of a partially completed BEOL anti-fuse device.

Specifically, the method embodiments of the present invention comprise providing a wafer 225 having a semiconductor substrate 301 with a front side 302 and a back side 303 (see FIG. 11). The wafer 225 can, for example, comprise a bulk silicon (Si) wafer or silicon-on-insulator (SOI) wafer.

During front end of the line (FEOL) processing of the wafer 225, a contact 226 can be formed within and at the back side 303 of the substrate 301 (905, see FIG. 11).

Next, an electrical connector 370 can be formed within the substrate 301 such that it is adjacent to and, more particularly, electrically connected to the back side contact 226 (906, see FIG. 11). This process of forming an electrical connector 370 can comprise forming a switch, such as a field effect transistor (see FIG. 4a), a diode (see FIG. 5a) or any other suitable semiconductor switch) within the semiconductor substrate 301 adjacent to the back side contact 226. Alternatively, the process of forming this electrical connector 370 can comprise forming a simple ohmic path within the substrate 301 adjacent to the back side contact 226.

Then, during back end of the line (BEOL) processing, at least one metal layer 311-313 (i.e., a wiring level, a metallization layer, etc.) can be formed on the front side 302 of the substrate 301 adjacent to the in-substrate electrical connector 370 (i.e., above the switch or simple ohmic path) (908). Specifically, during BEOL processing, interlayer dielectric layers 317-319 and metal layers 311-313 can be formed in an alternating pattern above the front side 302 of the substrate 301 and, more particularly, on the front side 302 of the substrate adjacent to the in-substrate electrical connector 370. As the interlayer dielectric 317-319 and metal layers 311-313 are formed, one or more via interconnects 316 are form in order to electrically connect the in-substrate electrical connector 370 (i.e., the in-substrate switch or simple ohmic path) to the top metal layer 313 in the alternating pattern. More specifically, conventional processing techniques can be used to form interlayer dielectric (ILD) 317-319 and metal layers 311-313 in an alternating pattern above the switch 370 (e.g., above a field effect transistor) such that the top layer of the pattern is a metal layer 313. The resulting top metal layer 313 will be the metal layer onto which the feature will be electroplated.

It should be noted that, as the ILD layers 317-319 and metal layers 311-313 are formed at process 908, if the electrical connector 370 comprises field effect transistor, then the gate 373 of the field effect transistor is physically wired (e.g., by via interconnect 316) to a metal pad 375 and this metal pad 375 can further be connected to a wire 376 that extends to the wafer's edge (see FIG. 4a). The pad 375 and wire 376 can be formed in one of the metal layers 311-313 above the substrate 301 such that they are electrically isolated from portion of the top metal layer 313 onto which the electroplated feature will be formed.

Next, dielectric layer 315 is formed (e.g., deposited) on the top metal layer 313 (914, see FIG. 11). Then, a trench 335 (e.g., a via hole, a contact hole, etc.) is formed in the dielectric layer 315 (e.g., using conventional lithographic patterning and etching techniques) such that a portion (i.e., cathode 220) of the top metal layer 313 is exposed at the bottom surface of the trench (916). That is, the dielectric layer 315 is patterned and etched so that the resulting trench 335 exposes that portion of the top metal layer 313 onto which the electroplated feature is subsequently to be formed. The process 916 of forming the trench 335 can be performed in conjunction with simultaneously forming one or more additional trenches 1100 (e.g., additional via/contact holes) (918, see FIG. 11).

Figure 12:
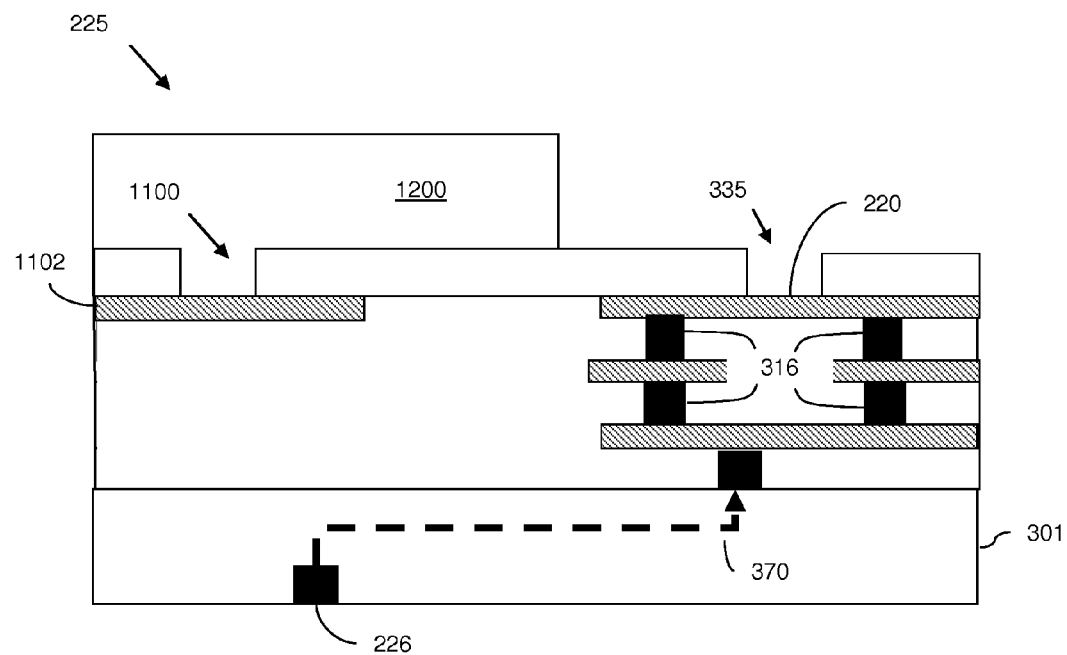
FIG. 12 is a cross-section diagram of a partially completed BEOL anti-fuse device.

These additional via/contact holes 1100 can subsequently be used (see process 934, discussed below) to form standard via interconnects/contacts 1101 (e.g., to metal layer 1102). If additional via/contact holes 1100 are formed at process 918, a mask 1200 can be formed (e.g., deposited and lithographically patterned) so as to protect these additional via/contact holes 1100 during electrodepositon of a feature into the trench 335 (920, See FIG. 12). Those skilled in the art will recognize that a mask 1200 over an additional via/contact hole 1100 would be required to prevent electroplating caused by any current flow to metal layer 1102, during electrodeposition of the feature into the trench 335. Specifically, if a current path is (not shown) is provided between an external power supply and the additional via/contact hole 1100 (e.g., by way of the back side contact 226 and electrical connector 370 or by some other means), a mask 1200 would be necessary because electrodeposition will occur in the via/contact hole 1200 in the presence of a current flow.

Figure 13:
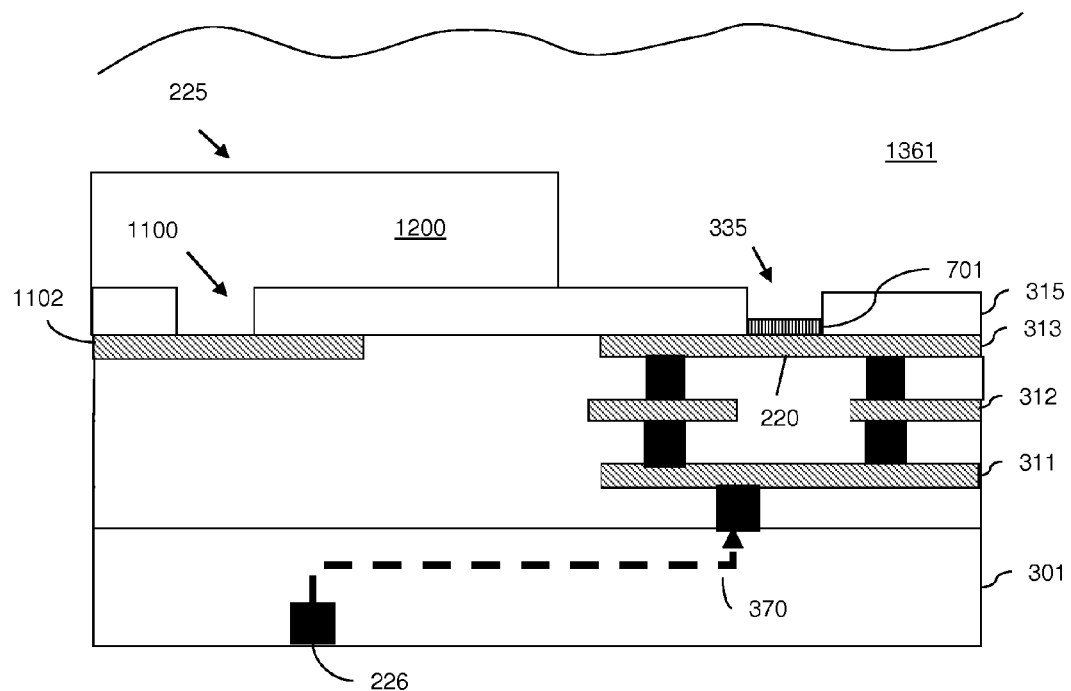
FIG. 13 is a cross-section diagram a partially completed BEOL anti-fuse device.
Figure 14:
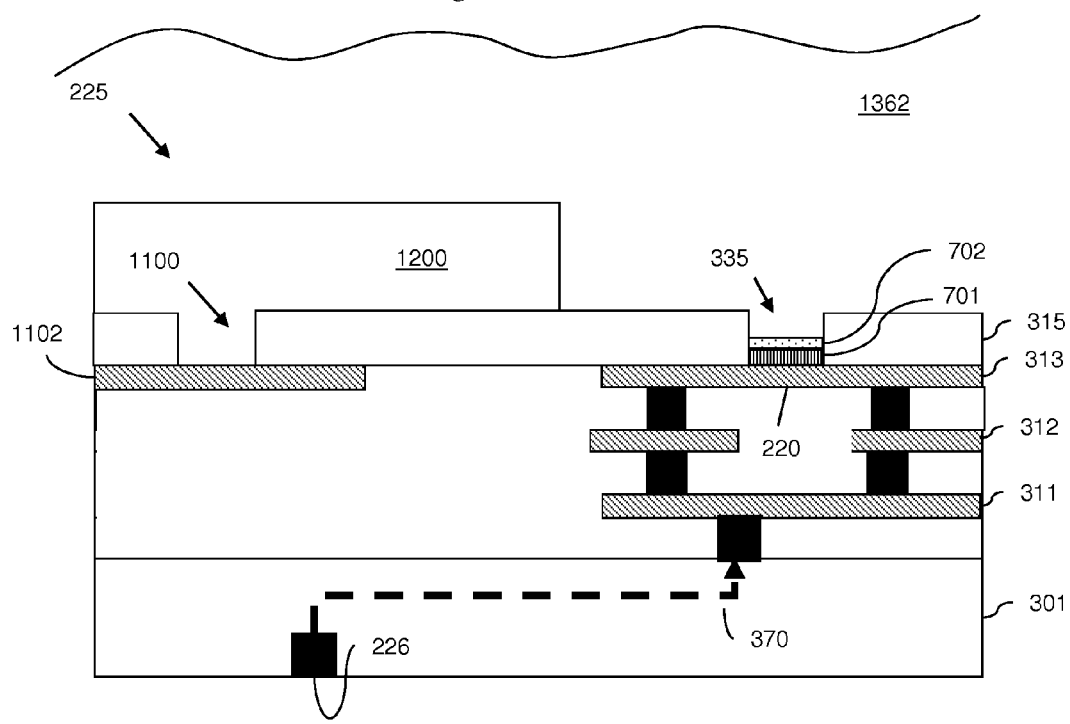
FIG. 14 is a cross-section diagram a partially completed BEOL anti-fuse device.
Figure 15:
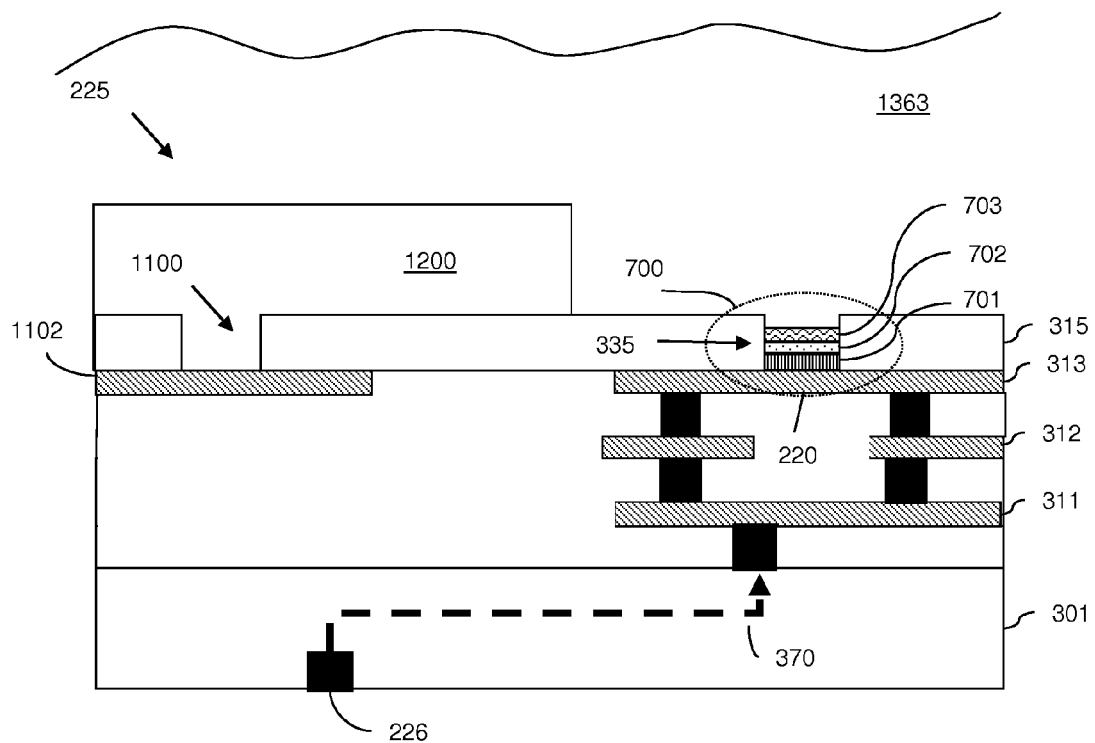
FIG. 15 is a cross-section diagram of a partially completed BEOL anti-fuse device.

Then, the desired feature is formed on the exposed portion of the top metal layer 313 in the trench 335 (i.e., on the cathode 220) (922, see for example, FIGS. 13-15). In order to form the desired feature, one or more electrodeposition processes are performed.

Specifically, referring to FIG. 2, a power supply 290 is electrically connected to an anode 210 and an electroplating rack 240 (924). The wafer 225 is then placed in the electroplating rack 240 such that the back side contact 226 and also wire 376 (if the electrical connector 370 is an in-substrate field effect transistor, as illustrated in FIG. 4a) are electrically connected to the rack 240 (926). The anode 210 and rack 240 (including the wafer 225) are submerged in an electroplating solution 260 contained in an electroplating bath 250 such that the exposed portion of the metal layer 313 at the bottom surface of the trench 335 (i.e., the cathode 220) is exposed to the electroplating solution 260 (928). Next, current flow from the power supply through the current path (i.e., through the rack 240, through back side contact 226, through the electrical connector 370, through any interconnect 316/intermediate metal layers 311-313, through the top metal layer 313 to the exposed portion of the metal layer at the bottom surface of the trench 335 (i.e., to the cathode 220) is selectively controlled (e.g., by either the electrical connector 370 (in the case of an in-substrate switch) or by the power supply 290 itself (in the case of an in-substrate simple ohmic path) (930). Selective control of current flow and, thereby, electron flow through this current path causes metal or alloy ions metal or alloy ions in the electroplating solution 260 to lose their charge and to electroplate the feature 700 onto the bottom surface of the trench 335 (i.e., onto cathode 220). This process can be repeated with different electroplating solutions and/or anodes to create different layers of electroplated material (e.g., layers 701-703 of feature 700) within the trench 335.

Figure 16:
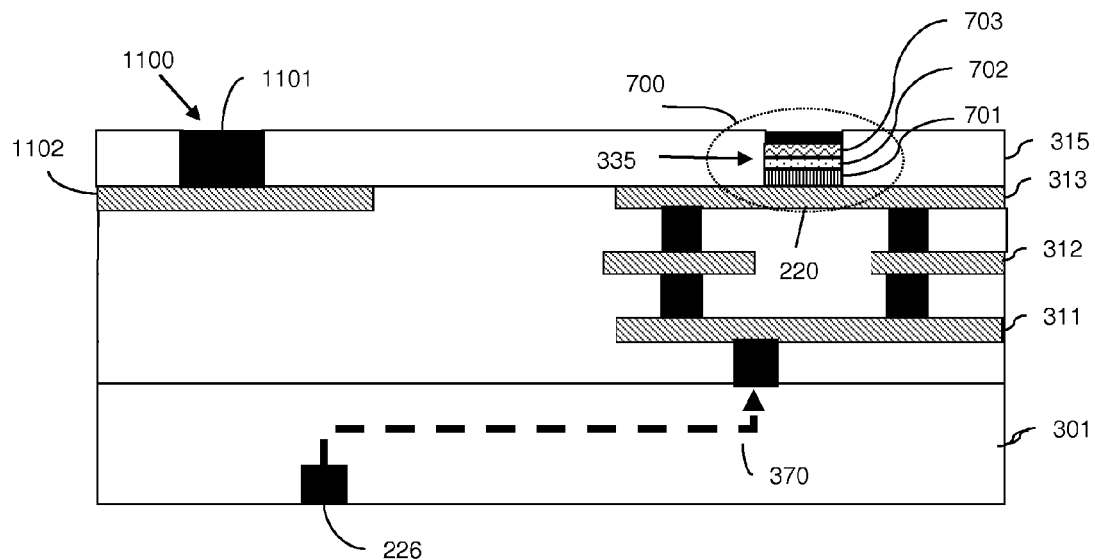
FIG. 16 is a cross-section diagram of a partially completed BEOL anti-fuse device.
Figure 17:
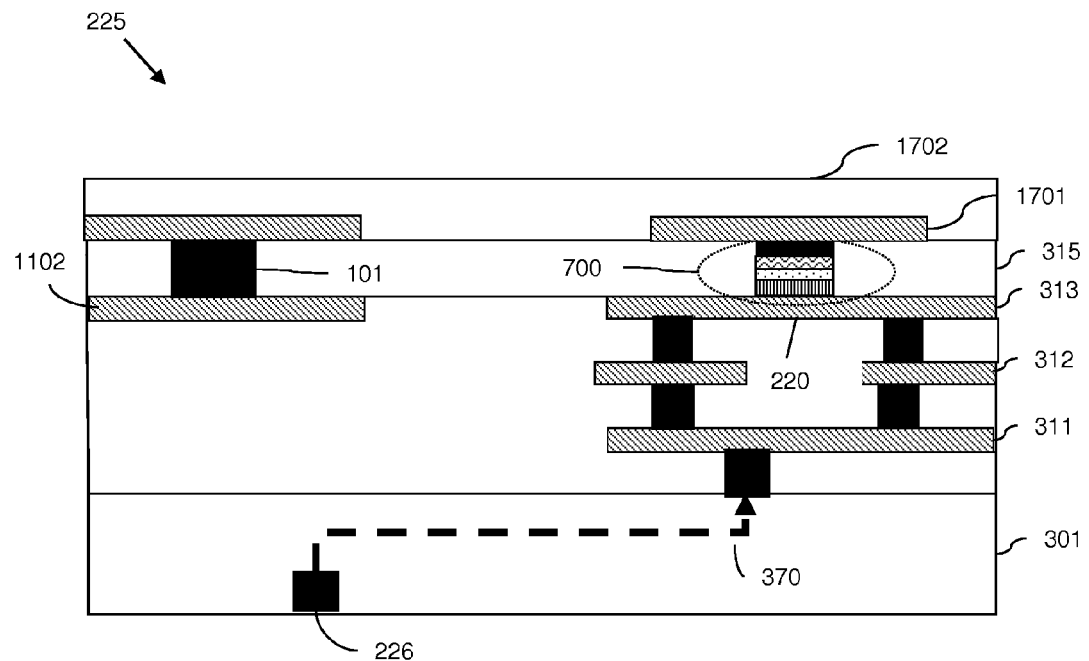
FIG. 17 is a cross-section diagram of a completed BEOL anti-fuse device.

Once the desired feature 700 is electroplated into the trench 335, the mask 1200 covering the additional via/contact holes 1100 can be removed (932) and standard via interconnects/contacts 1101 can be formed therein (934, see FIG. 16). As discussed above, for plating of the standard via interconnects/contact 1101 to occur current must flow to the metal layer 1102 at the bottom surface of the additional via/contact holes 1101. This current flow can be established through the use of any number of known techniques or structures (not shown). For example, current from the power source can flow across the wafer substrate generally. Alternatively, wire 1102 can be electrically connected to the power source by way of a second backside contact or by an electrical connection to any one of wires 311, 312, 313. Standard via interconnect formation can be followed by next metal layer 1701 and next ILD layer formation 1702, etc., to complete BEOL wafer processing (936, see FIG. 17).

Thus, the electroplating method, discussed above, can be used to electroplate any number of various different types of features on the wafer 225, including but not limited to, back end of the line (BEOL) conductors, insulators, metal-insulator-metal (MIM) structures, capacitors, anti-fuse devices, etc.

In one particular embodiment, this electroplating method can be used when forming one or more anti-fuse layers 701-703 of a BEOL in-via hole or in-contact hole anti-fuse device 700 on the semiconductor wafer 225 (as illustrated in FIG. 7 and further can be used when programming this BEOL anti-fuse device 700.

Figure 10:
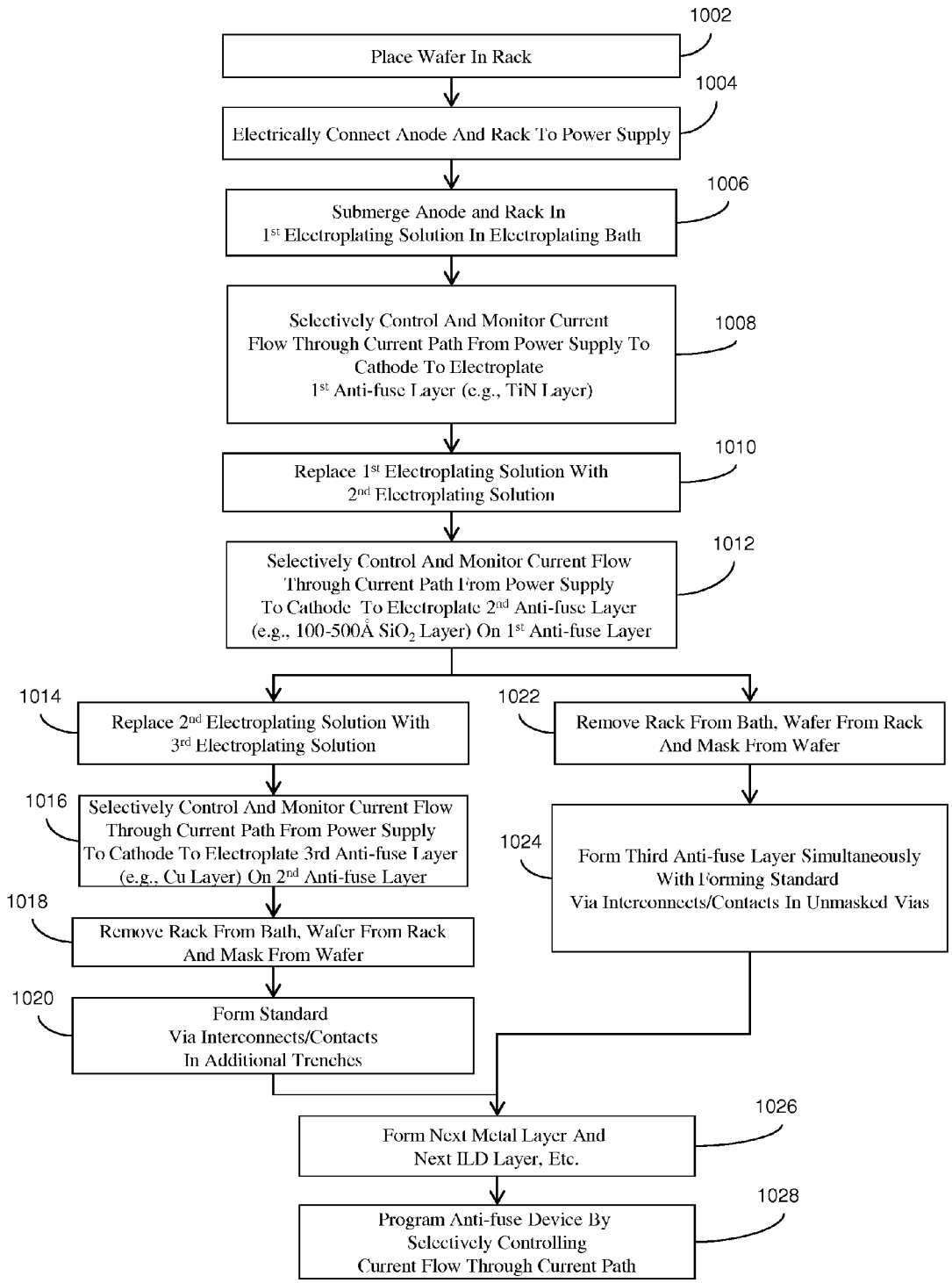
FIG. 10 is a flow diagram illustrating an embodiment of the method of FIG. 9 used particularly for forming the BEOL anti-fuse device of FIG. 7 and for programming that BEOL anti-fuse device.

More specifically, FIG. 10 is a flow diagram illustrating an embodiment of the method of FIG. 7 used particularly for forming the BEOL anti-fuse device 700 of FIG. 7 and for programming that BEOL anti-fuse device 700. Specifically, to accomplish this, the wafer 225 is first processed as described above in process steps 902-920 of FIG. 9. That is, a contact is formed within and at the back side of the wafer substrate (905). An electrical connector is formed within the substrate adjacent to the contact (906). A metal layer is formed on the front side of the substrate adjacent to the electrical connector (908). A dielectric layer is formed on the metal layer (914). A trench is formed in the dielectric layer so as to expose a portion of the metal layer at the bottom surface of the trench (916). Then, the BEOL anti-fuse device 700 is formed by forming a plurality of anti-fuse layers 701-703 in the trench 335. Specifically, referring to FIG. 10, when forming a BEOL anti-fuse device 700, the wafer 225 is place in an electroplating rack such that the back side contact 226 and also wire 376 (if the electrical connector 370 is an in-substrate field effect transistor, as illustrated in FIG. 4a) are electrically connected to the rack 240 (1002, see FIG. 2). The rack 240 and an anode 210 are electrically connected to a power supply 290 (1004).

Next, a first electrodepositon process is performed (1006-1008, see FIG. 13). This first electrodeposition process can comprise submerging the anode 210 and rack 240 (including the wafer 225) in a first electroplating solution 1361 in an electroplating bath such that the exposed portion of the metal layer 313 at the bottom surface of the trench (i.e., the cathode 220) is exposed to the first electroplating solution 1361 (1006). During this first electrodeposition process, current flow and, thereby, electron flow through the current path 385 from the power supply 290 to the exposed portion of the metal layer 313 at the bottom surface of the trench (i.e., to the cathode) is selectively controlled (e.g., by either the electrical connector 370 (in the case of an in-substrate switch) or by the power supply itself (in the case of an in-substrate simple ohmic path) to electroplate a first anti-fuse layer 701 onto the bottom surface of the trench 335 (1008, see FIG. 3b).

After the first anti-fuse layer 501 is electroplated onto the bottom surface of the trench 335, a second electrodepostion process can be performed (1010-1012, see FIG. 14). This second electrodeposition process can comprise removing the first electroplating solution 1361 from the electroplating bath and replacing it with a second electroplating solution 1362 (1010). During this second electrodeposition process, current flow and, thereby, electron flow through the current path 385 is selectively controlled (e.g., by either the electrical connector 370 (in the case of an in-substrate switch) or by the power supply itself (in the case of an in-substrate simple ohmic path) to electroplate a second anti-fuse layer 702 onto the first anti-fuse layer 701 within the trench 335 (1012, see FIG. 3b). Specifically, current flow is selectively controlled, during this second electrodeposition process, so that that the second anti-fuse layer will be approximately 100-500 angstroms (Å) thick.

After the second anti-fuse layer 701 is plated onto the first anti-fuse layer 702 at process 1012, a third electrodepositon processes can be performed (1014-1016, see FIG. 15). This third electrodeposition process can comprise removing the second electroplating solution 1362 from the electroplating bath and replacing it with a third electroplating solution 1363 (1014). During this third electrodeposition process, current flow and, thereby, electron flow through the current path 385 is selectively controlled (e.g., by either the electrical connector 370 (in the case of an in-substrate switch) or by the power supply itself (in the case of an in-substrate simple ohmic path) to electroplate a third anti-fuse layer 703 onto the second anti-fuse layer 702 within the trench 335 (1016, see FIG. 3b).

Again, once the electroplating processes are completed, the rack 240 can be removed from the electroplating bath, the wafer 225 can be removed from the rack 240 and the mask 1200 can be removed from the wafer 225 (1018). Then, standard via interconnect/contact processing can be performed in order to form standard via interconnects/contacts 1101, as necessary, in any unmasked hole 1100 and to fill any remaining unfilled portion of trench 335 (1020, see FIG. 16). As discussed above, for plating of the standard via interconnects/contact 1101 to occur current must flow to the metal layer 1102 at the bottom surface of the additional via/contact holes 1101. This current flow can be established through the use of any number of known techniques or structures (not shown). For example, current from the power source can flow across the wafer substrate generally. Alternatively, wire 1102 can be electrically connected to the power source by way of a second backside contact or by an electrical connection to any one of wires 311, 312, 313. Standard via interconnect processing can be followed by standard next level metal 1701 and ILD 1702 formation, etc., to complete BEOL wafer processing (1026, see FIG. 17).

Figure 18:
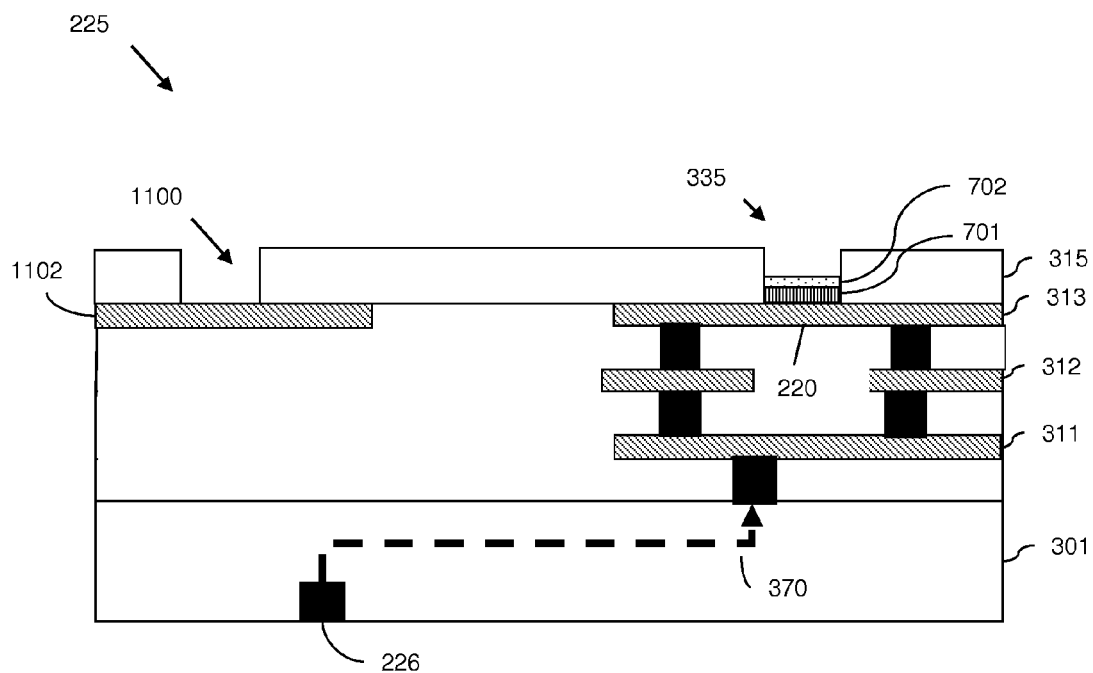
FIG. 18 is a cross-section diagram of a partially completed BEOL anti-fuse device.
Figure 19:
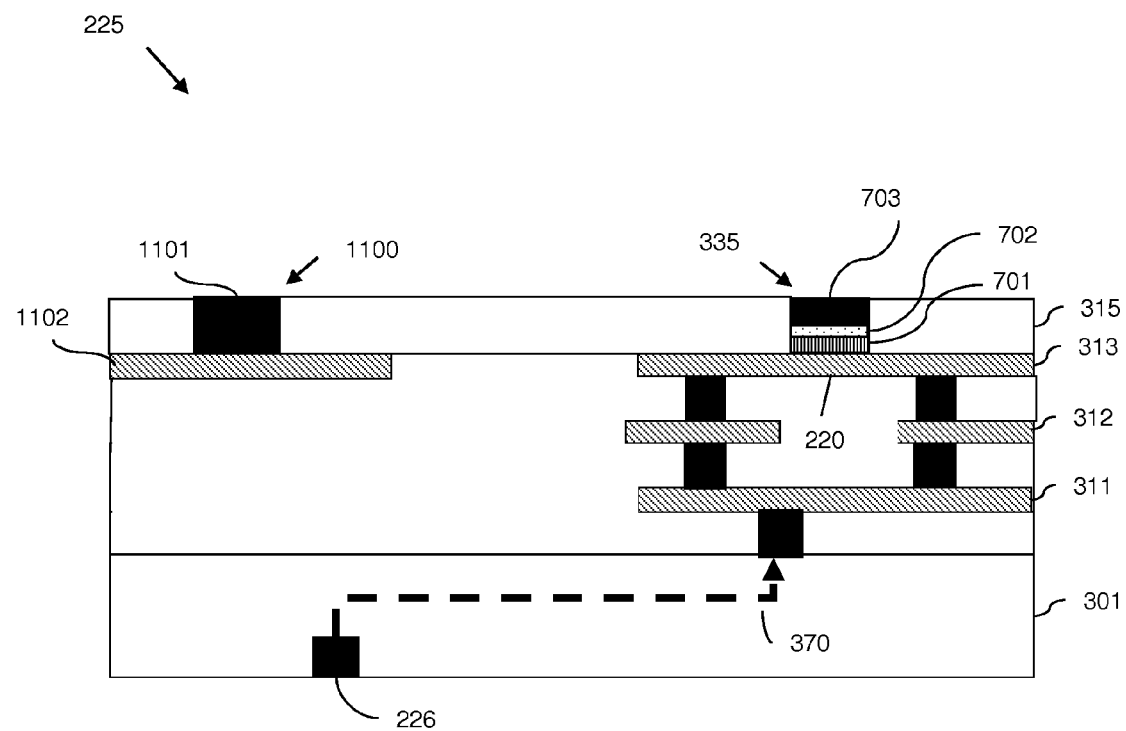
FIG. 19 is a cross-section diagram of a completed BEOL anti-fuse device.

Alternatively, after the second anti-fuse layer 702 is plated onto the first anti-fuse layer 701 at process 1012, the rack 240 can be removed from the bath 250, the wafer 225 can be removed from the rack 240 and the mask 1200 can be removed from the wafer 225 (1022, see FIG. 18). Then, a third anti-fuse layer 703 can be formed on the second anti-fuse layer 702 within the trench 335 simultaneously with forming at least one standard via interconnect 1101 or contact in an additional trench 1100 (i.e., in an additional via hole or contact hole) on the wafer 225 (1024, see FIG. 19). For example, after removing the mask 1200 from the wafer 225, the wafer 225 can be returned to the rack 240 and the rack 240 can be returned to the bath 250. The second electroplating solution can be replaced with a third electroplating solution. The wafer 225 is held in the third electroplating solution in the electroplating bath such that the second anti-fuse layer and additional unmasked trench 1100 are exposed to the third electroplating solution. As discussed above, for plating of the standard via interconnects/contact 1101 to occur current must flow to the metal layer 1102 at the bottom surface of the additional via/contact holes 1101. This current flow can be established through the use of any number of known techniques or structures (not shown). For example, current from the power source can flow across the wafer substrate generally. Alternatively, wire 1102 can be electrically connected to the power source by way of a second backside contact or by an electrical connection to any one of wires 311, 312, 313.

The above described method steps of FIG. 10 can be used to form a BEOL anti-fuse device 700 in which the first anti-fuse layer 701 comprises titanium nitride (TiN), the second anti-fuse layer 702 comprises silicon dioxide ($SiO_2$) and the third anti-fuse layer 703 comprises copper. That is, the particular method steps for forming an exemplary BEOL anti-fuse device can comprise first forming a titanium nitride (TiN) layer 701 on the bottom surface 220 of the trench by performing a first electrodeposition process (1006-1008). Next, a silicon dioxide ($SiO_2$) layer 702 can be formed on the titanium nitride (TiN) layer 701 by using a second electrodeposition process (1010-1012). Finally, a copper layer 703 can be formed on the silicon dioxide (SiO$_2$) layer 702 by using either a third electrodeposition process (1014-1016) or a standard via interconnect formation process (1022-1024).

As mentioned above, only upon programming at subsequent process step 1028 (i.e., by applying a current above a specified limit) does an anti-fuse device 700 provide a low resistance electrical connection due to migration of metal ions into the second anti-fuse layer 702. The BEOL anti-fuse device configuration (i.e., TiN—SiO$_2$—Cu) resulting from these exemplary method steps provides the added benefit of allowing for copper ion (Cu++) assist during anti-fuse programming. However, when forming the anti-fuse device 700, alternative anti-fuse conductive elements can include, but are not limited to, nickel (Ni), cobalt (Co), iron (Fe), copper (Cu), platinum (Pt) and rehium (Re).

It should be noted that it is important in semiconductor wafer processing to have inherent knowledge regarding the functionality of an anti-fuse (e.g., the functionality of the anti-fuse device 700, discussed in detail above, or for that matter an eFuse) once the wafer fabrication is complete. Having such apriori knowledge is an enabling feature of these electrical fuses. Specifically, various circuits within a chip (e.g., input-output blocks, memory bits, etc.) have redundant spares built into the chip. These spares can be used to non-functional circuits (e.g., non-functional input-output blocks, non-functional memory elements, etc.). Electrical fuses do not have such an option. Since an electrical anti-fuse is initially open and then during programming is closed, the two possible states of the anti-fuse can cause a permanent error in the anti-fuse use if a fabrication fault causes the anti-fuse to be stuck in one state or the other. The same situation exists for an eFuse; except that in the case of an eFuse the unprogrammed fuse is normally shorted, and after programming the eFuse is normally open. That is, if errors (e.g., lithographic patterning errors or fill errors) occur during prior art anti-fuse device fabrication and these errors result in a faulty anti-fuse device, then knowledge of the faulty device may not be known until after the product is in use and programming is attempted. However, with the anti-fuse formation method illustrated in FIG. 10 and described in detail above, electron flow can be monitored at each of the electrodeposition stages of fabrication (e.g., see steps 1008, 1012, 1016, etc.) to determine if plating has occurred and, thereby, to guarantee formation of the anti-fuse device structure. Such guaranteed formation is both a necessary and sufficient condition for anti-fuse enablement because it electrically guarantees 100% pre-programming yield. Again, 100% pre-programming yield was not possible with prior fabrication techniques because knowledge of the faulty device could not occur until programming was attempted. As such, the present method for forming an anti-fuse device minimizes or eliminates products being sent to customers with faulty anti-fuse devices that can not be programmed. That is, the above-described technique of forming an electroplated anti-fuse or eFuse with electron flow feedback ensures proper fabrication and maximizes unprogrammed yield.

Referring again to FIG. 10, once the BEOL anti-fuse device 700 is formed and the BEOL wafer processing is completed, the BEOL anti-fuse device 700 can be programmed by selectively controlling current flow through the current path in the same manner as described above for electrodeposition (1028). That is, referring to FIG. 8, a current path 885 can be established form a power supply 890 through the back side contact, through the electrical connector 370, through the metal layer 313 to the BEOL anti-fuse device 700 within the trench. Then, current flow through this current path 885 can be selectively controlled (e.g., by either the electrical connector 370 (in the case of an in-substrate switch) or the power supply 890 itself (in the case of a simple ohmic path) in order to apply a current above a specified limit to the anti-fuse device 700 and, more particularly to the first anti-fuse layer 702 adjacent to the bottom surface of the trench. This applied current will cause metal ions to migrate into the second anti-fuse layer 701, thereby, reducing resistance across the anti-fuse device 700 (i.e., thereby, programming the anti-fuse device 700).

Therefore, disclosed above are embodiments of a circuit and method for electroplating a feature, such as a back end of the line (BEOL) anti-fuse device, onto a semiconductor wafer. The electroplating circuit and method embodiments eliminate the use of a seed layer and, thereby, minimize subsequent processing steps (e.g., etching or chemical mechanical polishing (CMP)). Specifically, the circuit and method embodiments allow for selective electroplating of one or more metal or alloy materials onto an exposed portion of a metal layer in a trench on the front side of a semiconductor substrate. This is accomplished by providing a unique wafer structure that allows a current path to be established from a power supply through a back side contact and in-substrate electrical connector to the metal layer. During electrodeposition, current flow and, thereby, electron flow, through the current path can be selectively controlled. Additionally, if the electroplated feature is an anti-fuse device, current flow through this current path can also be selectively controlled in order to program the anti-fuse device.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:
1. A circuit structure comprising:
  a wafer comprising:
    a substrate having a front side and a backside;
    a contact at said back side of said substrate;
    an electrical connector within said substrate adjacent said contact;
    a metal layer on said front side of said substrate adjacent said electrical connector, wherein said electrical connector is adapted to provide an electrical connection between said contact and said metal layer; and
    a dielectric layer on said metal layer; and
    a trench in said dielectric layer, wherein an entire bottom surface of said trench comprises a portion of said metal layer,
  wherein said contact is adapted to connect to a power supply such that a current path is established from said power supply through said back side contact, said electrical connector and said metal layer to said bottom surface of said trench,
  wherein said power supply is adapted to pass a current through said current path and wherein one of said elec- trical connector and said power supply are adapted to selectively control flow of said current through said current path.

2. The circuit structure of claim 1, wherein said electrical connector comprises a switch and wherein said switch is adapted to selectively control said flow so as to at least one of:
   electroplate a feature onto said bottom surface of said trench, and
   program an anti-fuse device on said bottom surface of said trench.

3. The circuit structure of claim 1, wherein said electrical connector comprises a simple ohmic path and wherein said power supply is adapted to selectively control said flow so as to at least one of:
   electroplate a feature onto said bottom surface of said trench, and
   program an anti-fuse device on said bottom surface of said trench.

4. The circuit structure of claim 1, further comprising a rack electrically connected to said power supply, wherein said rack is adapted to hold said wafer in an electroplating solution such that said bottom surface of said trench is exposed to said electroplating solution and wherein said rack is further adapted to electrically connect said back side contact to said power supply.

5. A circuit structure comprising:
   a wafer comprising:
      a substrate having a front side and a back side;
      a contact at said back side of said substrate
      an electrical connector within said substrate adjacent said contact;
      a metal layer on said front side of said substrate adjacent said electrical connector, wherein said electrical connector is adapted to provide an electrical connection between said contact and said metal layer; and
      a dielectric layer on said metal layer; and
      a trench in said dielectric layer, wherein an entire bottom surface of said trench comprises a portion of said metal layer,
   wherein said contact is adapted to connect to a power supply such that a current path is established from said power supply through said back side contact, said electrical connector and said metal layer to said bottom surface of said trench,
   wherein said power supply is adapted to pass a current through said current path and wherein one of said electrical connector and said power supply are adapted to selectively control flow of said current through said current path,
      wherein said electrical connector comprises a switch and wherein said switch is adapted to selectively control said flow so as to at least one of:
         electroplate a feature onto said bottom surface of said trench, and
   program an anti-fuse device on said bottom surface of said trench.

6. The circuit structure of claim 5, wherein said electrical connector comprises a simple ohmic path and wherein said power supply is adapted to selectively control said flow so as to at least one of:
   electroplate a feature onto said bottom surface of said trench, and
   program an anti-fuse device on said bottom surface of said trench.

7. The circuit structure of claim 5, further comprising a rack electrically connected to said power supply, wherein said rack is adapted to hold said wafer in an electroplating solution such that said bottom surface of said trench is exposed to said electroplating solution and wherein said rack is further adapted to electrically connect said back side contact to said power supply.

* * * * *